US011474063B2

(12) United States Patent
Matsubara et al.

(10) Patent No.: US 11,474,063 B2
(45) Date of Patent: Oct. 18, 2022

(54) SEMICONDUCTOR DEVICE HAVING A POROUS METAL OXIDE FILM AND A SEMICONDUCTOR SUBSTRATE WITH A CONNECTION ELECTRICALLY CONNECTED TO THE POROUS METAL OXIDE FILM

(71) Applicant: Murata Manufacturing Co., Ltd., Nagaokakyo (JP)

(72) Inventors: Hiroshi Matsubara, Nagaokakyo (JP); Junko Izumitani, Nagaokakyo (JP); Hideaki Ooe, Nagaokakyo (JP); Masutaro Nemoto, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 176 days.

(21) Appl. No.: 16/851,243

(22) Filed: Apr. 17, 2020

(65) Prior Publication Data

US 2020/0249188 A1 Aug. 6, 2020

Related U.S. Application Data

(63) Continuation of application No. PCT/JP2018/045484, filed on Dec. 11, 2018.

(30) Foreign Application Priority Data

Dec. 20, 2017 (JP) .............................. JP2017-244061

(51) Int. Cl.
*H01L 21/02* (2006.01)
*G01N 27/16* (2006.01)
(Continued)

(52) U.S. Cl.
CPC ....... *G01N 27/16* (2013.01); *H01L 21/02172* (2013.01); *H01L 21/02203* (2013.01);
(Continued)

(58) Field of Classification Search
CPC ......... H01L 21/02172; H01L 21/02203; H01L 21/02258; H01L 21/265; H01L 21/02244; H01L 28/40; G01N 27/16
See application file for complete search history.

(56) References Cited

U.S. PATENT DOCUMENTS 8,658,277 B2    2/2014   Wyndham et al.
9,145,481 B2    9/2015   Wyndham et al.
(Continued)

FOREIGN PATENT DOCUMENTS

JP    H10121292 A    5/1998
JP    H116811 A    1/1999
(Continued)

OTHER PUBLICATIONS

International Search Report Issued for PCT/JP2018/045484, dated Mar. 12, 2019.
(Continued)

*Primary Examiner* — Nelson Garces
(74) *Attorney, Agent, or Firm* — ArentFox Schiff LLP

(57) ABSTRACT

A semiconductor device that includes a semiconductor substrate having a first main surface and a second main surface opposed to each other, and a porous metal oxide film on a side of the first main surface of the semiconductor substrate, the porous metal oxide film having a plurality of pores. The semiconductor substrate has a connection electrically connected to the porous metal oxide film, and the semiconductor substrate is configured to provide a power supply path from the second main surface to the connection on the first main surface.

8 Claims, 24 Drawing Sheets

(51) Int. Cl.
  *H01L 21/265* (2006.01)
  *H01L 49/02* (2006.01)
(52) U.S. Cl.
  CPC ...... *H01L 21/02258* (2013.01); *H01L 21/265* (2013.01); *H01L 28/40* (2013.01)

(56) References Cited

U.S. PATENT DOCUMENTS

| | | |
|---|---|---|
| 2005/0255581 A1 | 11/2005 | Kim et al. |
| 2008/0269368 A1 | 10/2008 | Wyndham et al. |
| 2014/0329919 A1 | 11/2014 | Wyndham et al. |
| 2018/0290882 A1* | 10/2018 | Rhee .................. B81C 1/00301 |
| 2019/0006334 A1* | 1/2019 | Gardner .................. H01L 28/40 |

FOREIGN PATENT DOCUMENTS

| | | | |
|---|---|---|---|
| JP | 2002064148 | A | 2/2002 |
| JP | 2005311352 | A | 11/2005 |
| JP | 2006510229 | A | 3/2006 |
| JP | 2007206039 | A | 8/2007 |
| JP | 2013038197 | A | 2/2013 |
| JP | 6199339 | B2 | 9/2017 |

OTHER PUBLICATIONS

Written Opinion of the International Searching Authority issued for PCT/JP2018/045484, dated Mar. 12, 2019.

* cited by examiner

SEMICONDUCTOR DEVICE HAVING A POROUS METAL OXIDE FILM AND A SEMICONDUCTOR SUBSTRATE WITH A CONNECTION ELECTRICALLY CONNECTED TO THE POROUS METAL OXIDE FILM

CROSS REFERENCE TO RELATED APPLICATIONS

The present application is a continuation of International application No. PCT/JP2018/045484, filed Dec. 11, 2018, which claims priority to Japanese Patent Application No. 2017-244061, filed Dec. 20, 2017, the entire contents of each of which are incorporated herein by reference.

FIELD OF THE INVENTION

The present invention relates to a semiconductor device including a porous metal oxide film, and a manufacturing method therefor.

BACKGROUND OF THE INVENTION

Porous metal oxide films are provided by, for example, self-organization that forms a columnar regular pore structure when aluminum is anodized in an acidic electrolyte. Such porous metal oxide films have been studied for applications to filters, photonic crystals, recording media, sensors, and the like with the use of increased surface areas, internal spaces of pores, high regularity, and the like.

For example, Patent Document 1 discloses a method for producing an anodized film, in which after a through hole is provided in advance in a support substrate, a film to be anodized is attached to the support substrate, an anode wire for anodization is taken out through the through hole, and while the back surface of the support substrate is suctioned, the entire film to be anodized is anodized by immersion in an anodizing solution.

In this method of anodizing the film, however, there is a need to peel off, from the support substrate, a porous metal oxide film (anodized film) produced by anodization, and transfer the porous metal oxide film to a semiconductor device or the like. Moreover, even if a semiconductor device including the film to be anodized is attached to a support substrate, it is not possible to produce an anodized film by a similar method for the semiconductor device including an insulating layer inside for providing circuits, elements, and the like.

For example, Patent Document 2 discloses a method for manufacturing a semiconductor device that includes a step of providing a film to be anodized and which is etched in a predetermined pattern on a surface of the semiconductor device, and a step of forming a porous metal oxide film by anodizing the film to be anodized.

Patent Document 1: Japanese Patent Application Laid-Open No. 61-99339
Patent Document 2: Japanese Patent Application Laid-Open No. 11-006811

SUMMARY OF THE INVENTION

In the method for manufacturing a semiconductor device described in Patent Document 2, however, there is a need to provide, on the side closer to the surface of a semiconductor substrate wafer, a power supply pad that supplies a formation voltage for anodization, a power supply line that electrically connects the film to be anodized and the power supply pad, and the like. For this reason, the number of semiconductor devices that can be manufactured per surface area of the semiconductor substrate wafer is decreased. Moreover, if the distance between the power supply pad and each film to be anodized, that is, the length of the power supply line, is different, the conditions for anodization vary for each film to be anodized, and each porous metal oxide film varies in quality.

The present invention has been realized in view of such circumstances, and an object of the present invention is to provide a semiconductor device which is capable of improving the manufacturing efficiency.

A semiconductor device according to one aspect of the present invention includes a semiconductor substrate having a first main surface and a second main surface opposed to each other; and a porous metal oxide film on a side of the first main surface of the semiconductor substrate, the porous metal oxide film having a plurality of pores. The semiconductor substrate has a connection electrically connected to the porous metal oxide film on the side of the first main surface of the semiconductor substrate, and the semiconductor substrate is configured to provide a power supply path from the second main surface to the connection.

A method for manufacturing a semiconductor device according to another aspect of the present invention includes: preparing a semiconductor substrate having a first main surface and a second main surface opposed to each other; providing a film to be anodized on a side of the first main surface of the semiconductor substrate; and supplying power from the second main surface of the semiconductor substrate to anodize the film to be anodized so as to form a porous metal oxide film with a plurality of pores.

According to the present invention, it is possible to provide a semiconductor device which is capable of improving the manufacturing efficiency.

DETAILED DESCRIPTION OF THE INVENTION

Figure 1:
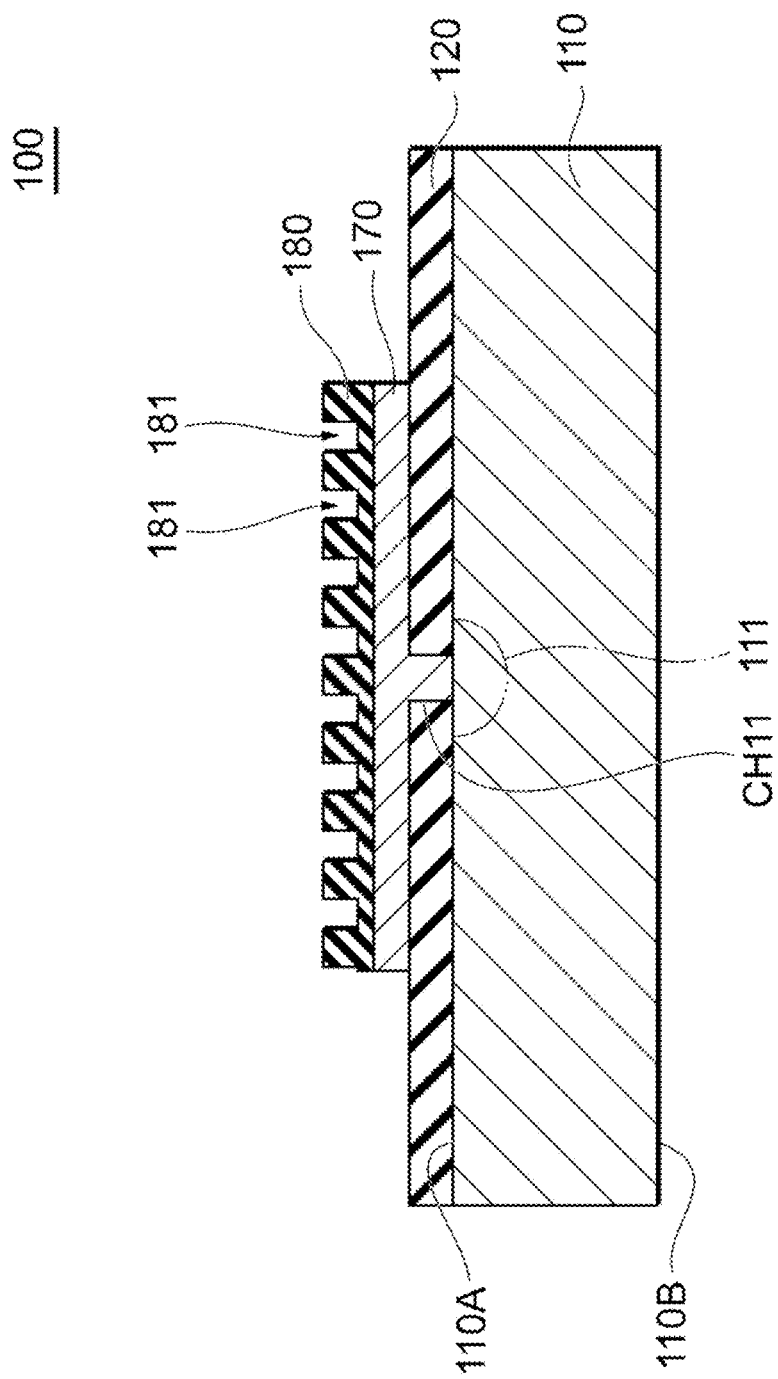
FIG. 1 is a cross-sectional view schematically illustrating the configuration of a semiconductor device according to a first embodiment.

Embodiments of the present invention will be described below with reference to the drawings. In each of second and subsequent embodiments, however, constituent elements that are the same as or similar to those of the first embodiment are denoted by reference numerals that are the same as or similar to those of the first embodiment, and detailed descriptions thereof will be omitted appropriately. Furthermore, regarding the advantageous effects achieved in each of the second and subsequent embodiments, the descriptions of advantageous effects which are similar to those of the first embodiment will be omitted appropriately. The drawings of the respective embodiments are considered by way of example, and the dimensions and shapes of the respective parts are considered schematic, and thus, the technical scope of the present invention should not be considered limited to the embodiments.

In the respective drawings, in order to clarify the mutual relationships between the respective drawings and help understanding of the positional relationships between the respective members, an orthogonal coordinate system (XYZ coordinate system) composed of an X axis, a Y axis, and a Z axis may be used for the sake of convenience. In this case, for example, a direction parallel to the X axis is referred to as an "X axis direction". The same applies to directions parallel to the other axes. In the following description, a Z-axis positive direction side is referred to as "upper". It is to be noted that the X axis direction is not limited to the positive direction of an arrow, but is intended to also include the negative direction opposite to the arrow. In addition, a plane parallel to the plane specified by the X axis and the Y axis is referred to as an "XY plane", and the same applies to planes parallel to the planes specified by the other axes.

First Embodiment

Figure 2:
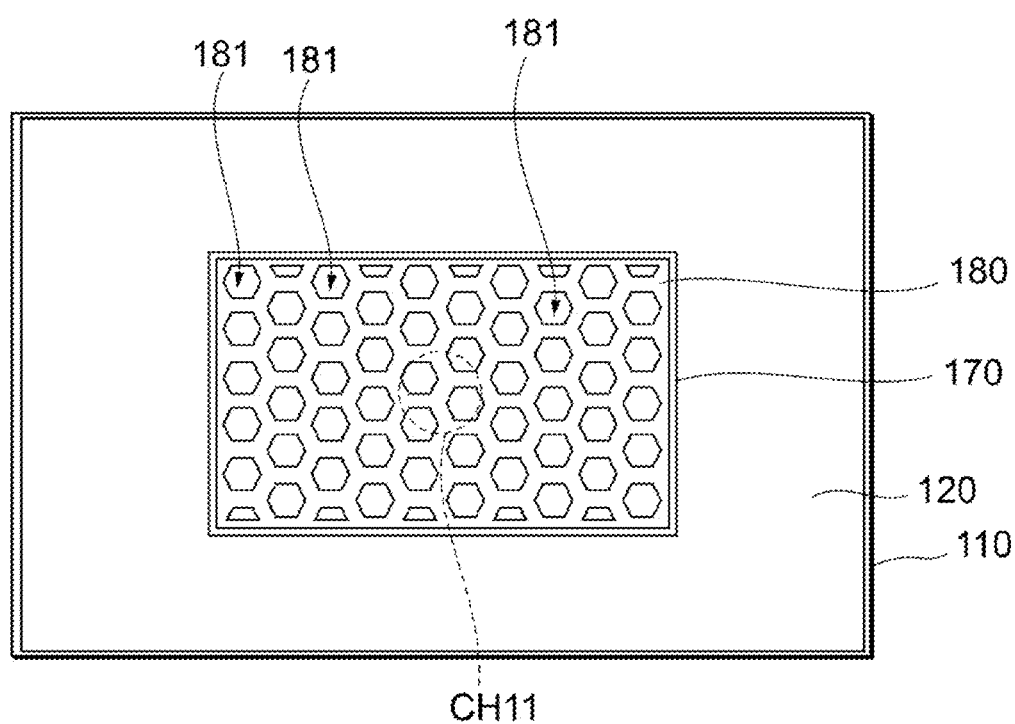
FIG. 2 is a plan view schematically illustrating the configuration of the semiconductor device according to the first embodiment.

First, the configuration of a semiconductor device 100 according to a first embodiment of the present invention will be described with reference to FIGS. 1 and 2. FIG. 1 is a cross-sectional view schematically illustrating the configuration of the semiconductor device according to the first embodiment. FIG. 2 is a plan view schematically illustrating the configuration of the semiconductor device according to the first embodiment.

The semiconductor device 100 corresponds to, for example, an integrated circuit including a circuit, an element, and the like. The semiconductor device 100 includes a semiconductor substrate 110, an insulating film 120, a power supply line 170, and a porous metal oxide film 180.

The semiconductor substrate 110 has a first main surface 110A and a second main surface 110B parallel to the XY plane. The first main surface 110A is a main surface on the Z-axis positive direction side, and the second main surface 110B is a main surface on the Z-axis negative direction side. As viewed from the normal direction of the first main surface 110A, the semiconductor substrate 110 has a rectangular shape. The shape of the semiconductor substrate 110 is, however, not to be considered limited to the forgoing, and may be a polygonal shape, a circular shape, an elliptic shape, or a combination thereof.

The semiconductor substrate 110 functions as a power supply pad to which an external terminal is connected for supplying a formation voltage to an anode provided on the side closer to the first main surface 110A of the semiconductor substrate 110 in anodization. Specifically, in the manufacturing process, a film to be anodized is provided on the side closer to the first main surface 110A of the semiconductor substrate 110, and powered from an external terminal connected to the side closer to the second main surface 110B of the semiconductor substrate 110. In this way, the film to be anodized is anodized to form the porous metal oxide film 180 as an anodized film on the side closer to the first main surface 110A of the semiconductor substrate 110. As described above, in order to supply power from the second main surface 110B of the semiconductor substrate 110 to the first main surface 110A, the semiconductor substrate 110 has a connection 111 electrically connected to the porous metal oxide film 180 on the side closer to the first main surface 110A, and is configured to provide a power supply path from the second main surface 110B to the connection 111 on the first main surface 110A.

In this regard, the semiconductor device 100 is compared with a semiconductor device formed by supplying a formation voltage to a plurality of films to be anodized, through a plurality of power supply lines derived from a power supply pad provided on the side closer to a first main surface of a semiconductor substrate wafer. More specifically, the comparison is made with a semiconductor device where a semiconductor substrate is provided with no connection, but only a power supply line electrically connected to a porous metal oxide film remains on the first main surface side. According to the present embodiment, for example, there is no need to provide any power supply pad or power supply line on the first main surface side of the semiconductor substrate wafer, thus making it possible to increase the number of semiconductor devices 100 which can be manufactured per semiconductor substrate wafer. Furthermore, the semiconductor device 100 is capable of reducing variations in formation voltage due to differences in length between respective power supply lines that supply the formation voltage to respective films to be anodized. More specifically, the semiconductor device 100 is capable of reducing variations in pore density and size between a plurality of porous metal oxide films formed on the same semiconductor substrate wafer. From the foregoing, it is possible to provide the semiconductor device 100 which is capable of improving the manufacturing efficiency. Furthermore, the semiconductor device 100 is capable of improving the adhesion strength of the porous metal oxide film 180, as compared with the configuration of a porous metal oxide film provided by transfer for the semiconductor device. Thus, it is possible to improve the reliability of the semiconductor device 100.

The semiconductor substrate 110 is formed from, for example, a p-type or n-type silicon substrate. The material of the semiconductor substrate 110 is not to be considered particularly limited, and may be formed from a compound semiconductor substrate such as silicon carbide (SiC) or gallium arsenide (GaAs). The semiconductor substrate 110 is not to be considered limited to the foregoing as long as the second main surface 110B of the substrate has a semiconductor, and may be, for example, a silicon on insulator (SOI) substrate. The electrical resistivity of the semiconductor substrate 110 is desirably 100 Ω·cm or less. This resistivity allows power loss within the semiconductor substrate 110 to be reduced in applying a formation voltage with an external terminal connected to the second main surface 110B of the semiconductor substrate 110. Thus, it is possible to reduce variations in the pore density and size of the porous metal oxide film 180, depending on the position of each semiconductor substrate 110 in the semiconductor substrate wafer.

The connection 111 desirably has, at the first main surface 110A of the semiconductor substrate 110, a region that is lower in electrical resistivity than the surrounding area. For example, in a case where the semiconductor substrate 110 is a silicon substrate, the connection 111 has a high-concentration region that is higher in impurity concentration than the surrounding area. This allows the interface between the semiconductor substrate 110 and the power supply line 170 to be brought into ohmic contact. More specifically, in the manufacturing process for the semiconductor device 100, power loss at the interface between the semiconductor substrate 110 and the power supply line 170 can be reduced.

The insulating film 120 is provided between the semiconductor substrate 110 and the porous metal oxide film 180. The insulating film 120 covers, for example, the first main surface 110A of the semiconductor substrate 110. The insulating film 120 is provided as, for example, a silicon oxide ($SiO_2$), a silicon nitride (SiN), an alumina ($Al_2O_3$), or the like. The insulating film 120 is provided by a physical vapor deposition (PVD) method or a chemical vapor deposition (CVD) method. The insulating film 120 may be provided by thermal oxidation of the semiconductor substrate 110. For example, in a case where the semiconductor substrate 110 is a silicon substrate, the insulating film 120 as a silicon oxide can be provided by thermally oxidizing the semiconductor substrate 110.

The insulating film 120 has a through hole CH11 formed therein. The through hole CH11 penetrates the insulating film 120 in a Z-axis direction. The through hole CH11 has an overlap with the connection 111 in the case of the first main surface 110A of the semiconductor substrate 110 in planar view. More specifically, the porous metal oxide film 180 is electrically connected to the connection 111 of the semiconductor substrate 110 through the through hole CH11. As described above, even when the insulating film 120 is provided between the semiconductor substrate 110 and the porous metal oxide film 180, the porous metal oxide film 180 can be formed for the semiconductor device 100 by power supply from the side closer to the second main surface 110B of the semiconductor substrate 110. In the example shown in FIG. 2, the through hole CH11 has an overlap with the porous metal oxide film 180, but may be located outside the porous metal oxide film 180. It is to be noted that the insulating film 120 may be omitted. More specifically, the porous metal oxide film 180 may be provided on the semiconductor substrate 110 or on the semiconductor layer of the multilayer substrate.

The power supply line 170 electrically connects the connection 111 and the porous metal oxide film 180. The power supply line 170, which corresponds to a part of the first metal film, is provided on the insulating film 120 and inside the through hole CH11. The power supply line 170 is provided, thereby allowing the connection 111 to be provided outside the porous metal oxide film 180 in the case of the first main surface 110A of the semiconductor substrate 110 in planar view. Thus, elements, circuits, and the like can be provided between the semiconductor substrate 110 and the porous metal oxide film 180. The power supply line 170 has contact with the connection 111 of the semiconductor substrate 110, and has contact with the surface of the porous metal oxide film 180 closer to the semiconductor substrate 110. More specifically, in the case of the first main surface 110A of the semiconductor substrate 110 in planar view, the power supply line 170 has an overlap with the porous metal oxide film 180. For this reason, in the case of forming the porous metal oxide film 180 by anodizing the film to be anodized, it is possible to suppress the variation in formation voltage in the plane of the film to be anodized. Accordingly, it is possible to reduce variations in pore density and size in the plane of the porous metal oxide film 180.

The power supply line 170 includes Al, Cu, Ti, Ta, or the like. The power supply line 170 may have a single-layer structure or a multilayer structure. In the case of the multilayer structure, the power supply line 170 includes, for example, a barrier layer including Ti, TiN, Ta, TaN, or the like on the side closer to the insulating film 120, and includes a similar cap layer on the opposite side. Between the barrier layer and the cap layer, a conductive layer including W, Al, Cu, or the like is provided.

The porous metal oxide film 180 is formed on the side closer to the first main surface 110A of the semiconductor substrate 110. The porous metal oxide film 180 has a plurality of pores 181. The plurality of pores 181 are, in the porous metal oxide film 180, opened toward the side opposite to the semiconductor substrate 110, and extend in the Z-axis direction. This allows the surface area of the porous metal oxide film 180 on the side opposite to the semiconductor substrate 110 to be increased. The plurality of pores 181 are, for example, regularly arranged in a direction parallel to the XY plane. The opening shape of each of the plurality of pores 181 is, for example, a hexagonal shape in the case of first main surface 110A of the semiconductor substrate 110 in planar view. The opening shape of each of the plurality of pores 181 is not to be considered limited to the foregoing, and may be a polygonal shape such as a triangular or quadrangular shape, a circular shape, an elliptic shape, or a combination thereof.

Examples of the porous metal oxide film 180 include anodized films such as an aluminum oxide ($Al_2O_3$), a tantalum oxide ($Ta_2O_5$), a titanium oxide ($TiO_2$), a zirconium oxide ($ZrO_2$), a silicon oxide, a tin oxide, a zinc oxide, and a tungsten oxide. The porous metal oxide film 180 is, however, not to be considered limited to the foregoing, and may be another anodized film.

For example, the porous metal oxide film 180 may be an anodized film of an alloy such as AlSi, AlCu, or AlSiCu.

Figure 3:
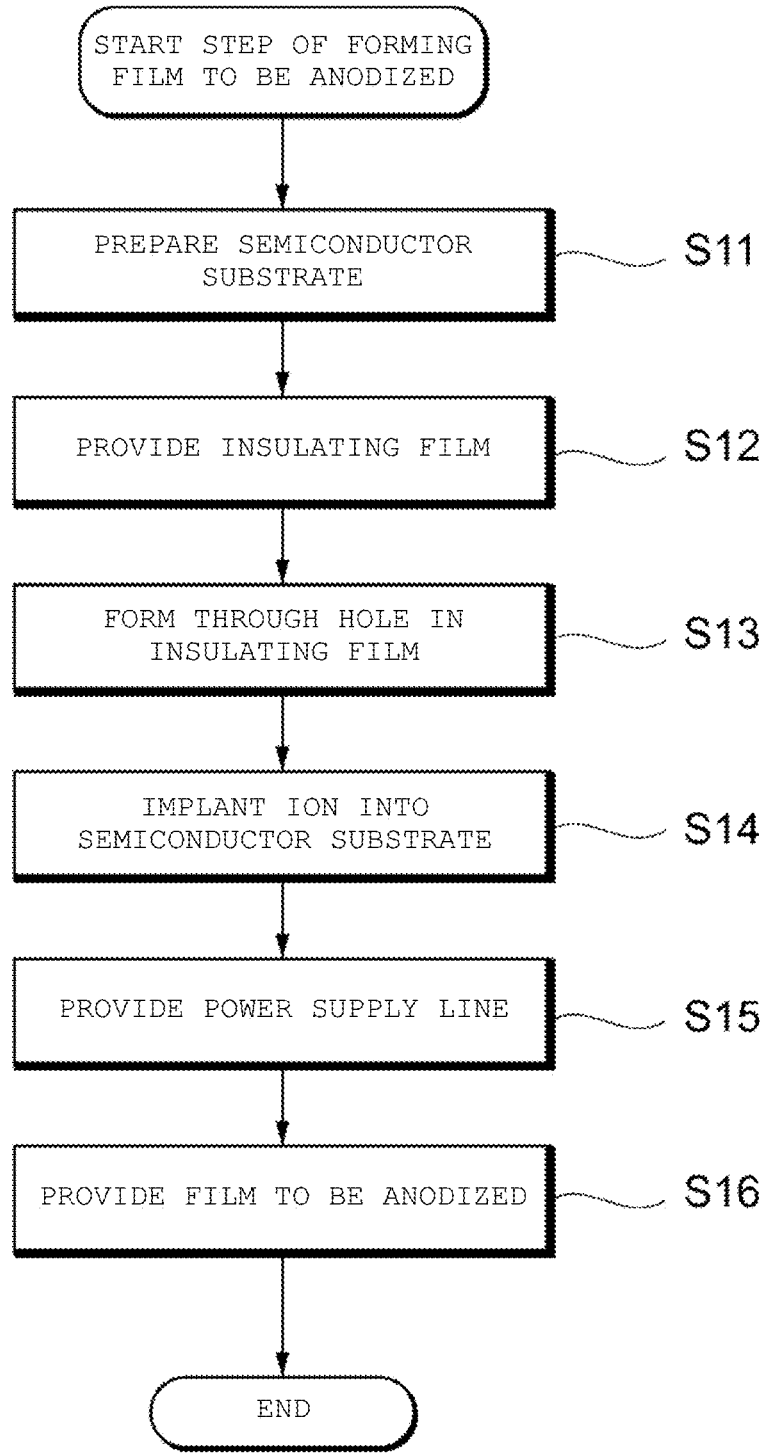
FIG. 3 is a flowchart schematically showing a process for forming a film to be anodized in a method for manufacturing the semiconductor device according to the first embodiment.
Figure 4:
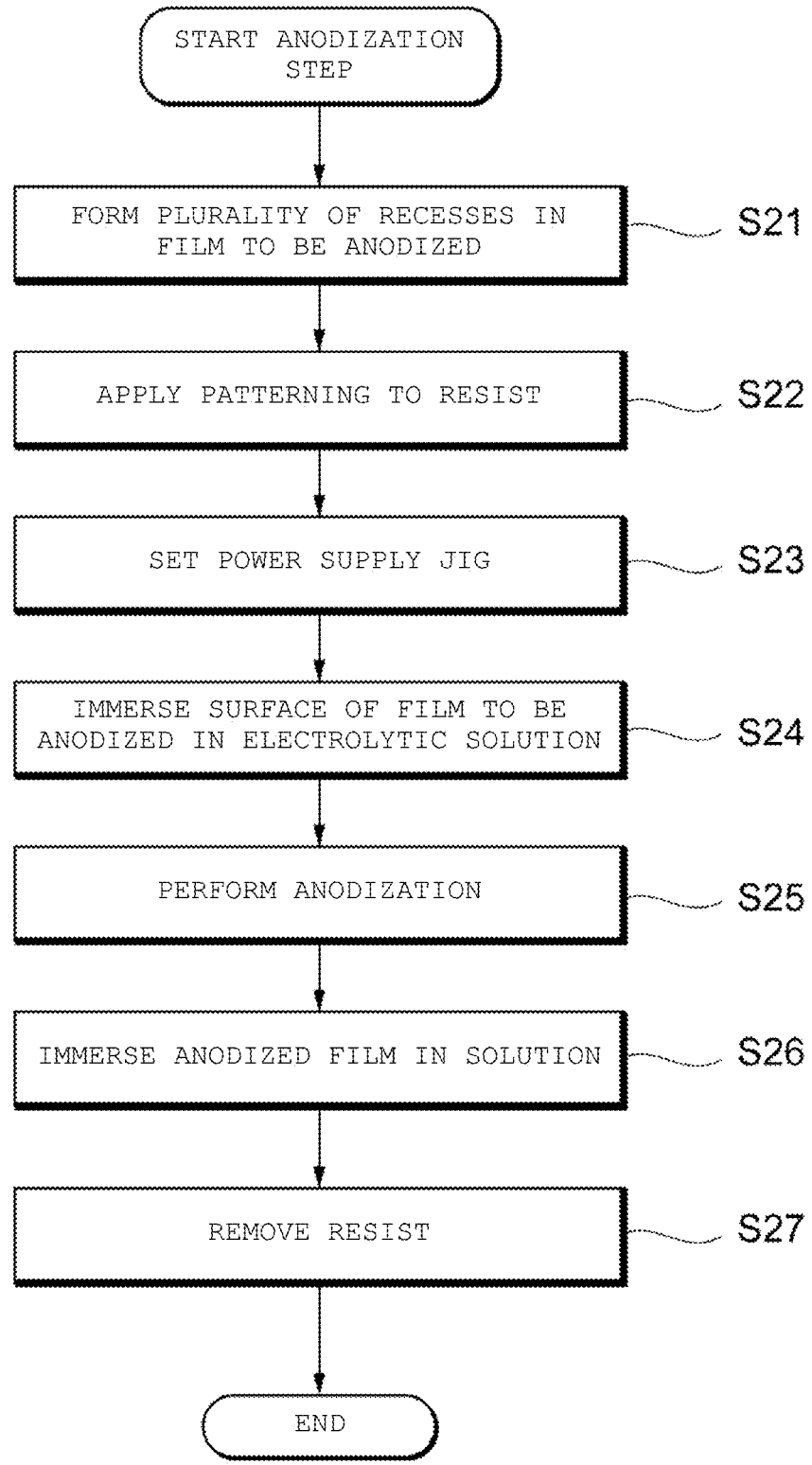
FIG. 4 is a flowchart schematically showing a process for anodization in the method for manufacturing the semiconductor device according to the first embodiment.
Figure 5:
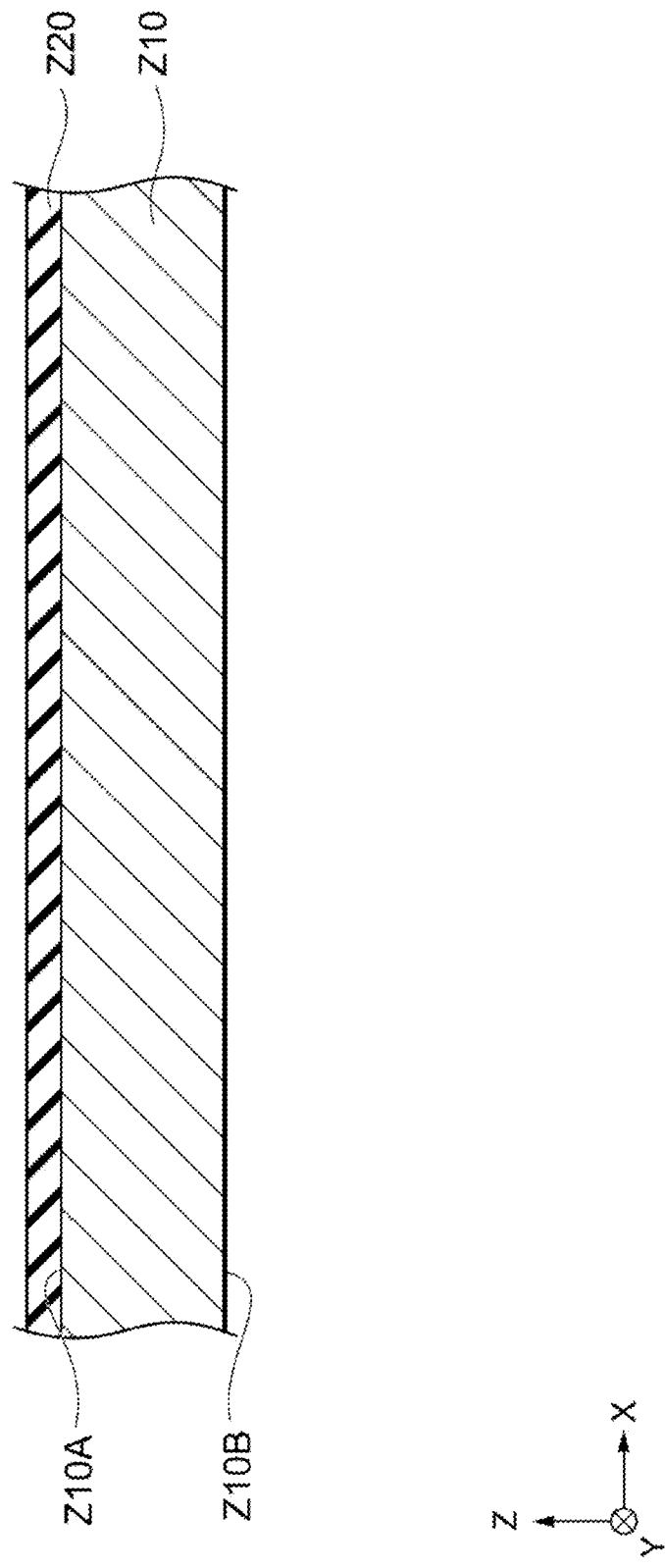
FIG. 5 is a cross-sectional view schematically illustrating a step of providing an insulating film.
Figure 6:
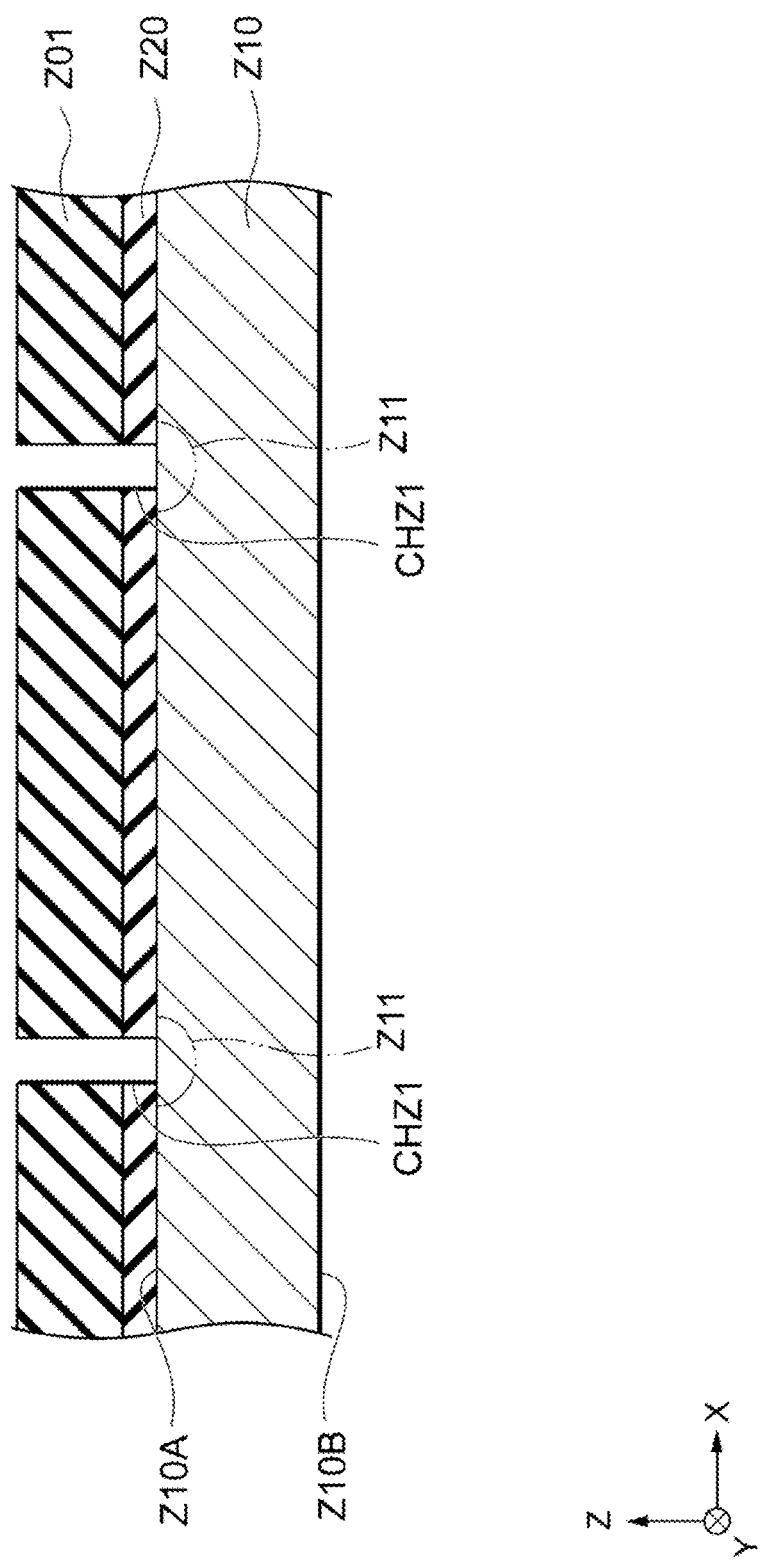
FIG. 6 is a cross-sectional view schematically illustrating a step of providing a high-concentration region.
Figure 7:
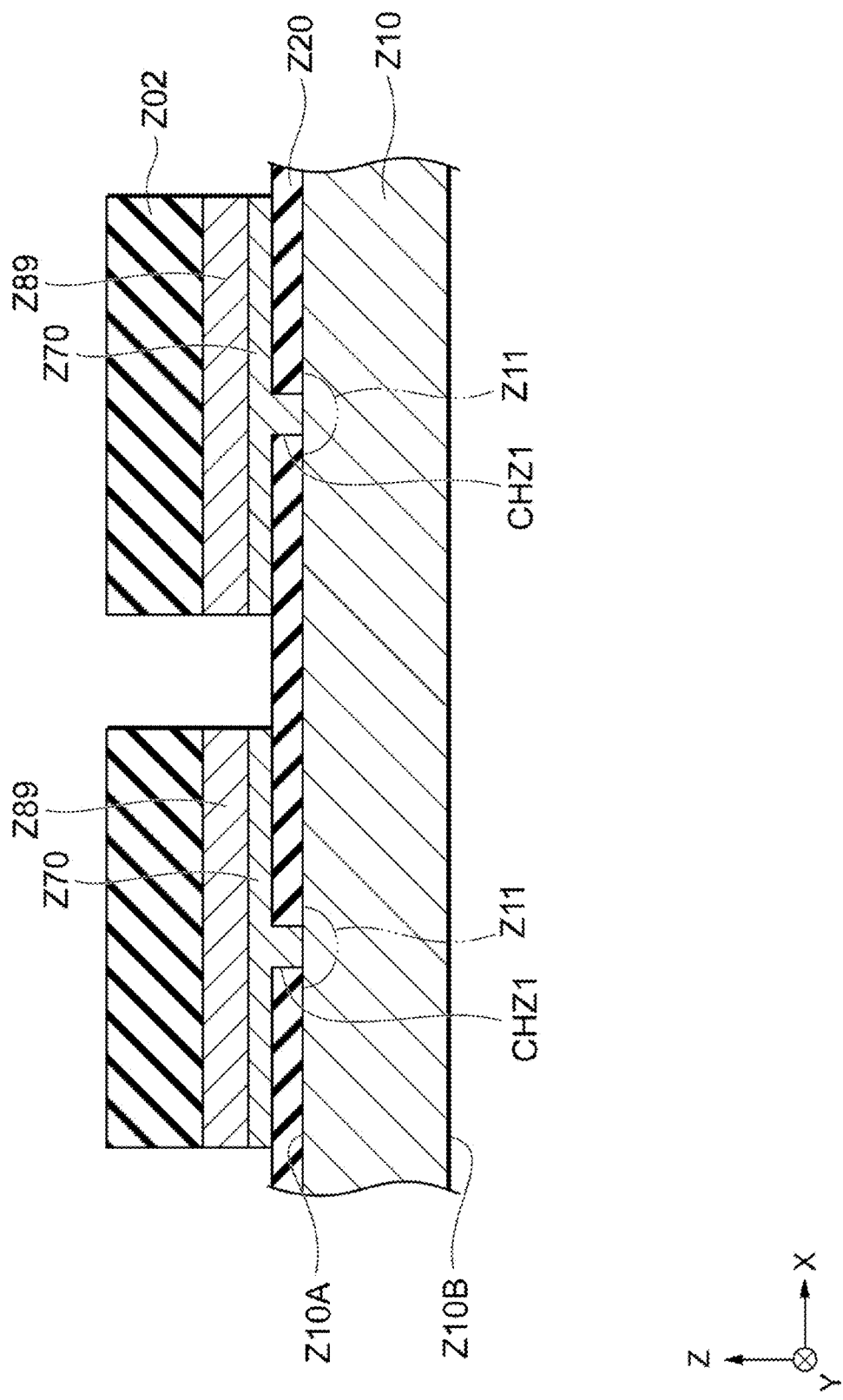
FIG. 7 is a cross-sectional view schematically illustrating a step of providing the film to be anodized.
Figure 8:
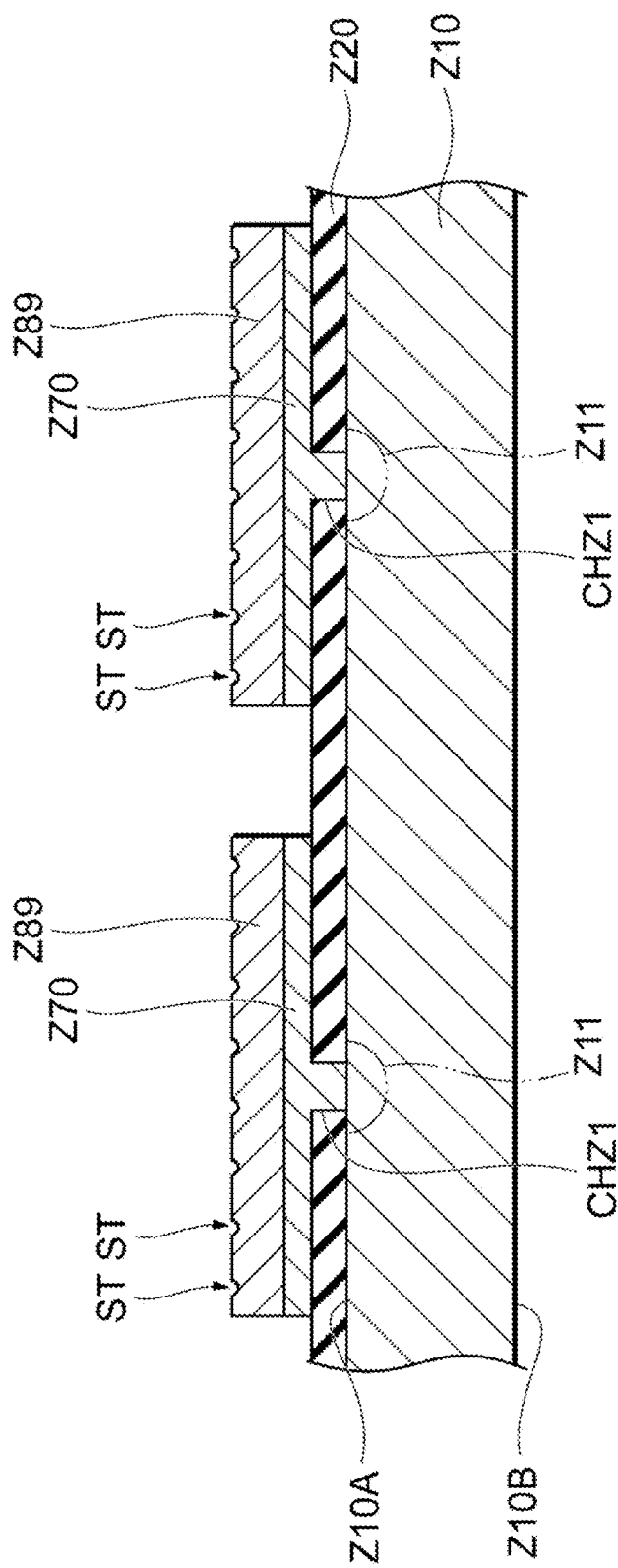
FIG. 8 is a cross-sectional view schematically illustrating a step of providing a plurality of recesses in the film to be anodized.
Figure 9:
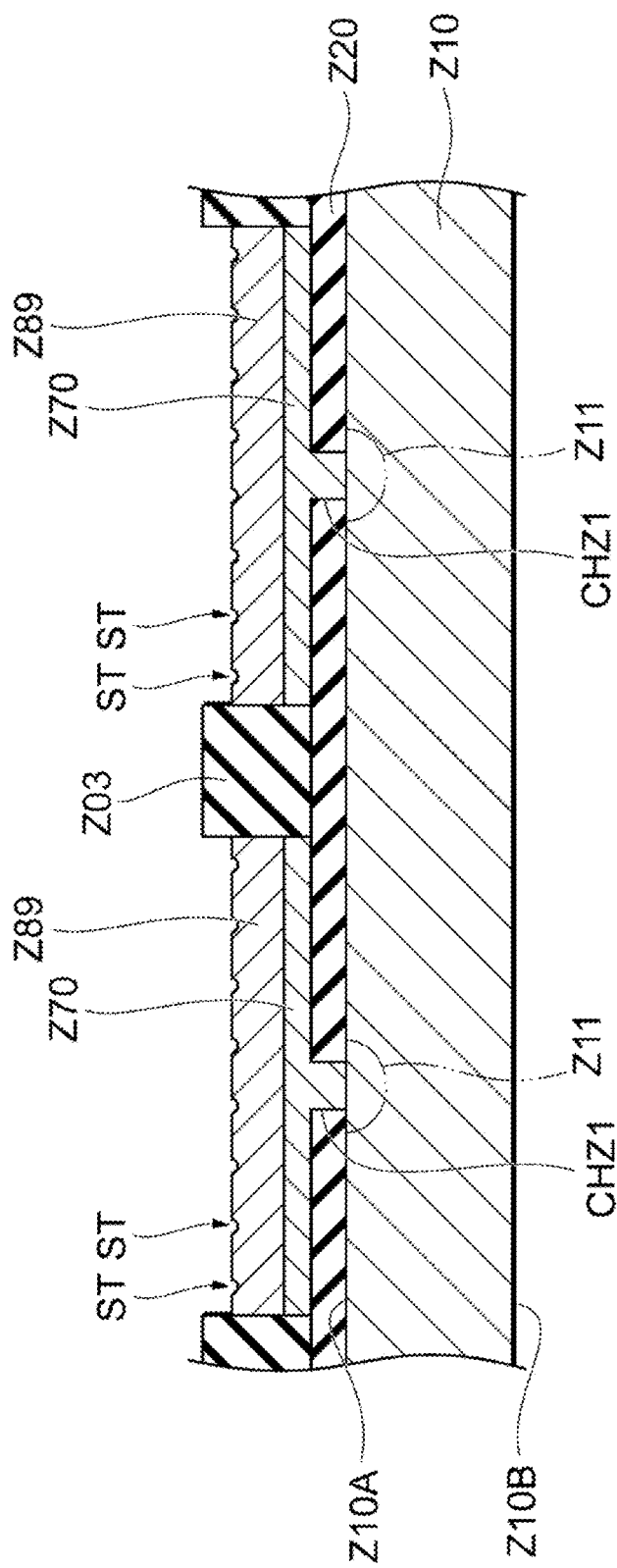
FIG. 9 is a cross-sectional view schematically illustrating a step of patterning a resist.
Figure 10:
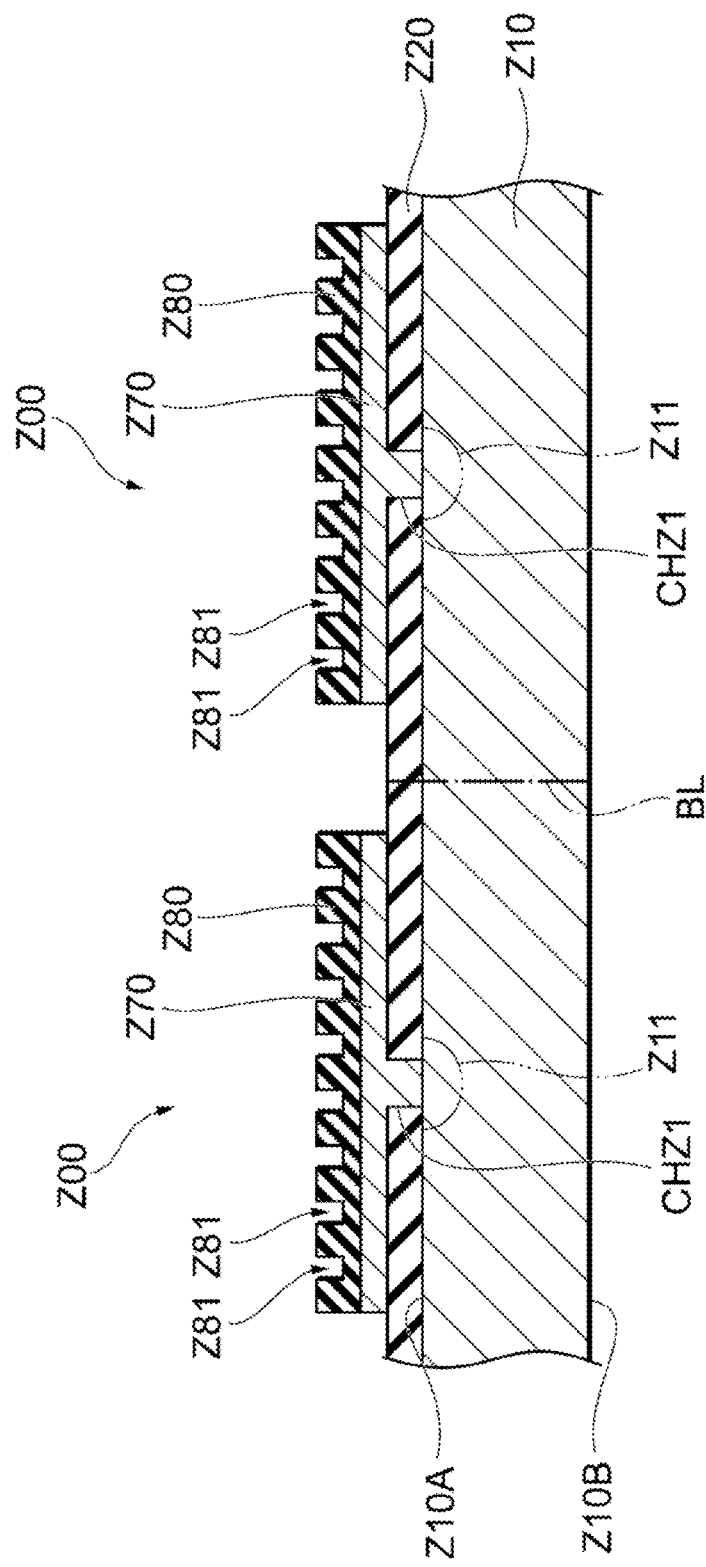
FIG. 10 is a cross-sectional view schematically illustrating a step of cutting a semiconductor substrate wafer to divide the semiconductor substrate wafer into a plurality of semiconductor devices.

Next, a method for manufacturing the semiconductor device 100 according to the first embodiment will be described with reference to FIGS. 3 to 10. FIG. 3 is a flowchart schematically showing a process for forming a film to be anodized in a method for manufacturing the semiconductor device according to the first embodiment. FIG. 4 is a flowchart schematically showing a process for anodization in the method for manufacturing the semiconductor device according to the first embodiment. FIG. 5 is a cross-sectional view schematically illustrating a step of providing an insulating film. FIG. 6 is a cross-sectional view schematically illustrating a step of providing a high-concentration region. FIG. 7 is a cross-sectional view schematically illustrating a step of providing the film to be anodized. FIG. 8 is a cross-sectional view schematically illustrating a step of providing a plurality of recesses in the film to be anodized. FIG. 9 is a cross-sectional view schematically illustrating a step of patterning a resist. FIG. 10 is a cross-sectional view schematically illustrating a step of cutting a semiconductor substrate wafer to divide the semiconductor substrate wafer into a plurality of semiconductor devices.

First, a semiconductor substrate Z10 is prepared (S11). In this regard, the semiconductor substrate Z10 with a first main surface Z10A and a second main surface Z10B opposed to each other is prepared. The semiconductor substrate Z10 corresponds to a collective board on which a plurality of semiconductor devices can be formed, and a semiconductor substrate wafer or a divided semiconductor substrate wafer is used therefor. The semiconductor substrate Z10 is prepared in accordance with a step of forming a common semiconductor substrate wafer.

Next, an insulating film Z20 is provided (S12). The insulating film Z20 is provided on the first main surface Z10A of the semiconductor substrate Z10. As shown in FIG. 5, the insulating film Z20 covers the first main surface Z10A of the semiconductor substrate Z10. The insulating film Z20 is provided by a PVD method, a CVD method, a thermal oxidation treatment, or the like. It is to be noted that the insulating film Z20 may be prepared first, and the semiconductor substrate Z10 may be provided on the insulating film Z20. For example, on the insulating film Z20, a semiconductor thin film such as low-temperature polycrystalline silicon (LIPS) may be provided as the semiconductor substrate Z10.

Next, through holes CHZ1 are formed in the insulating film Z20 (S13). First, a resist Z01 is provided so as to cover the insulating film Z20. Next, as shown in FIG. 6, openings corresponding to the through holes CHZ1 are formed by patterning in the resist Z01. Next, the insulating film Z20 is etched with the resist Z01 as a mask.

Next, ions are implanted into the semiconductor substrate Z10 (S14). Impurity ions are implanted from the first main surface Z10A of the semiconductor substrate Z10. In this regard, with the insulating film Z20 as a mask, impurity ions are implanted into connections Z11 through the through hole CHZ1. Thus, the connections Z11 can be made into high-concentration regions. It is to be noted that the method for forming the connections Z11 is not limited to the above-mentioned method as long as the electrical resistivity can be decreased, and excimer laser irradiation, plasma processing, or the like may be used.

Next, a power supply line Z70 is provided (S15). The power supply line Z70 is provided on the insulating film Z20. In this regard, the power supply line Z70 fills the through holes CHZ1 to have contact with the connections Z11. It is to be noted that the inside of the connection Z11 may be filled with a via electrode. In such a configuration, the power supply line Z70 is electrically connected to the connections Z11 through the via electrode. Furthermore, in such a configuration, even in the case of the large thickness of the insulating film Z20 in the Z-axis direction, it is possible to suppress breaking of the electrical connection between the power supply line Z70 and the semiconductor substrate Z10.

Next, a film Z89 to be anodized is provided (S16). The film Z89 to be anodized is provided on the power supply line Z70. The material for the film Z89 to be anodized is not to be considered particularly limited as long as the material is anodized to form a porous metal oxide film, and provided as, for example, Al, Ta, Ti, Zr, Sn, Zn, AlSi, AlCu, AlSiCu or the like. The power supply line Z70 and the film Z89 to be anodized are subjected to patterning. In the example shown in FIG. 7, the power supply line Z70 and the film Z89 to be anodized are subjected to patterning by etching with the use of the resist Z02. The power supply line Z70 and the film Z89 to be anodized may be collectively etched in the same pattern, or may be etched in different patterns.

Next, a plurality of recesses ST are formed in the film Z89 to be anodized (S21). As shown in FIG. 8, the plurality of recesses ST are provided on the side of the film Z89 to be anodized, opposite to the semiconductor substrate Z10. The plurality of recesses ST correspond to starting points for the plurality of pores of the porous metal oxide film. More specifically, the plurality of pores are formed in the Z-axis direction from the plurality of recesses ST. The plurality of recesses ST are formed by pressing a mold against the film Z89 to be anodized and then transferring the irregularities of the mold surface. Providing a plurality of recesses ST in the film Z89 to be anodized in advance as described above is referred to as texturing. The texturing is performed, thereby allowing the regularity of the plurality of pores of the porous metal oxide film to be increased. The shape and arrangement of the plurality of pores of the porous metal oxide film can be controlled by the shape and arrangement of the plurality of recesses ST. It is to be noted that the step of forming the plurality of recesses ST in the film Z89 to be anodized may be omitted. Even in such a case, the conditions for anodization are suitably set, thereby forming a plurality of pores in the porous metal oxide film through self-organization.

Next, a resist Z03 is subjected to patterning (S22). The resist Z03 is intended to prevent the side surface of the film Z89 to be anodized and the power supply line Z70 from being brought into contact with an electrolytic solution at the time of anodization, and opened in a region opposed to the film Z89 to be anodized in the Z-axis direction.

Next, a power supply jig is set (S23). The power supply jig is connected to the second main surface 10B of the semiconductor substrate Z10. The power supply jig electrically connects the semiconductor substrate Z10 and an external power supply, and holds the semiconductor substrate Z10 with an air chuck or the like.

Next, the surface of the film Z89 to be anodized is immersed in the electrolytic solution (S24). For example, in a case where the film Z89 to be anodized is Al, AlSi, AlCu, or AlSiCu, a sulfuric acid, an oxalic acid, a phosphoric acid, or the like can be used for the electrolytic solution.

Next, anodization is performed (S25). The porous metal oxide film Z80 with pores of 5 to 200 nm in diameter can be formed by supplying a formation voltage of 5 to 100 V as an anode to the film Z89 to be anodized. Thereafter, the porous metal oxide film Z80 can be also immersed in a solution capable of dissolving alumina, such as phosphoric acid, thereby increasing the diameters of the pores to a desired size. Further, not only a direct-current (DC) method, but also an alternating-current (AC) method, an AC/DC superposition method, and a pulse method can be applied as a power supply method.

Next, the resist is removed (S26). After removing the resist Z03, the semiconductor substrate Z10 is cut along a dicing line BL, and then divided into a plurality of individual semiconductor devices Z00. The method for cutting the semiconductor substrate Z10 may be a method with a dicing saw or stealth dicing with a laser.

Figure 11:
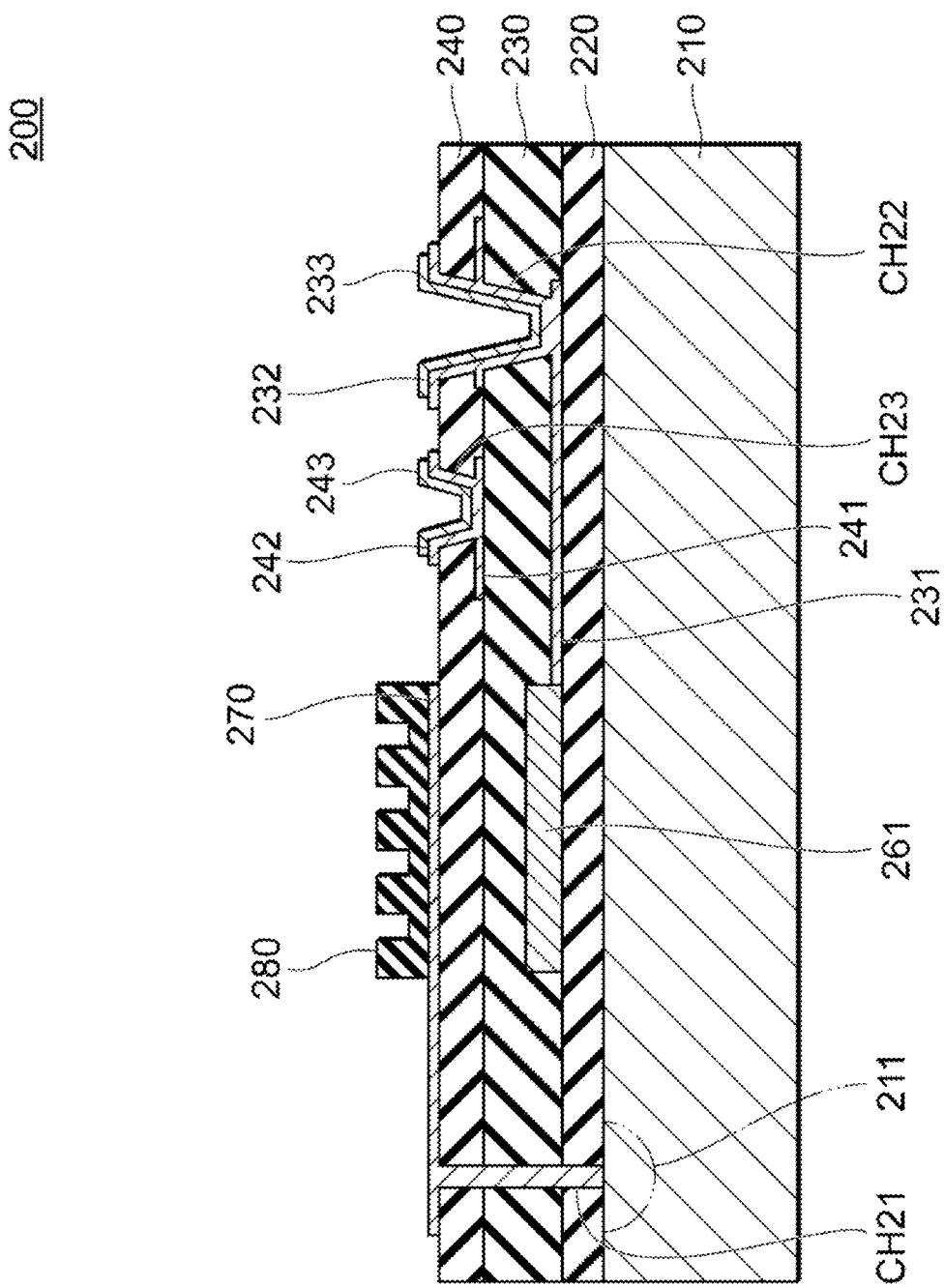
FIG. 11 is a cross-sectional view schematically illustrating the configuration of a semiconductor device according to a second embodiment.

Next, the configuration of a semiconductor device 200 according to the second embodiment will be described with reference to FIG. 11. FIG. 11 is a cross-sectional view schematically illustrating the configuration of the semiconductor device according to the second embodiment.

The semiconductor device 200 according to the second embodiment includes a semiconductor substrate 210, an insulating film 220, a power supply line 270, and a porous metal oxide film 280, as with the semiconductor device 100. Furthermore, the semiconductor substrate 210 is provided with a connection 211, and the power supply line 270 is electrically connected to the semiconductor substrate 210 through a through hole CH21.

The semiconductor device 200 according to the second embodiment is different from the semiconductor device 100 in that the semiconductor device 200 includes insulating films 230 and 240, signal lines 231, 232, 241, and 242, electrode pads 233 and 243, and an element 261.

The insulating film 230 is provided between the insulating film 220 and the porous metal oxide film 280. The insulating film 230 is provided on the insulating film 220. The insulating film 240 is provided between the insulating film 230 and the porous metal oxide film 280. The insulating film 240 is provided on the insulating film 230. The insulating film 230 has a through hole CH22 formed therein, and the insulating film 240 has a through hole CH23 formed therein. The through hole CH22 also penetrates the insulating film 240. It is to be noted that the through hole CH21 also penetrates the insulating films 230 and 240.

The signal lines 231, 232, 241, and 242 transmit an input signal to the semiconductor device 200 or an output signal from the semiconductor device 200. The signal line 231 is provided between the insulating film 220 and the insulating film 230, and the signal line 232 is provided in the through hole CH22 and on the insulating film 240. The signal line 232 is electrically connected to an external circuit. The signal line 231 is electrically connected to the signal line 232 in the through hole CH22. The signal line 241 is provided between the insulating film 230 and the insulating film 240, and the signal line 242 is provided in the through hole CH23 and on the insulating film 240. The signal line 242 is electrically connected to an external circuit. The signal line 241 is electrically connected to the signal line 242 in the through hole CH23. The power supply line 270, the signal line 232, and the signal line 242 each correspond to a part of the first metal film. The power supply line 270, the signal line 232, and the signal line 242 can be provided simultaneously in accordance with the same step. The power supply line 270, the signal line 232, and the signal line 242 are, however, electrically separated from each other. This separation allows the semiconductor substrate 210 and the power supply line 270 to be grounded.

The electrode pad 233, which is a connection terminal for electrically connecting to an external circuit, is provided on the signal line 232. The electrode pad 243, which is a connection terminal for electrically connecting to an external circuit, is provided on the signal line 242. The electrode pad 233 and the electrode pad 243 are connected to an external circuit by, for example, wire bonding, and thus are desirably made from a material which has favorable adhesion to the bonding wire. The film to be anodized for the porous metal oxide film 280 before the anodization may be formed as a metal film of the same layer as the electrode pad 233 and the electrode pad 243. More specifically, the film to be anodized is provided simultaneously with the electrode pad 233 and the electrode pad 243 in accordance with the same step. Then, only the film to be anodized may be anodized to provide the porous metal oxide film 280. In this regard, the porous metal oxide film 280 has an oxide of the metal material included in the electrode pad 233 and the electrode pad 243. This allows the manufacturing process for the semiconductor device to be simplified.

The element 261 is provided between the insulating film 220 and the insulating film 230, and electrically connected to the signal line 231. The element 261 is provided, for example, between the semiconductor substrate 210 and the porous metal oxide film 280. The element 261 is various types of elements, for example, a circuit element such as a resistor, an inductor, a capacitor, a diode, or a thin film transistor (TFT), a semiconductor element, or a circuit of these elements combined. As described above, for the semiconductor device 200, the porous metal oxide film 280 can be formed directly on the circuit board integrated by lamination.

In the semiconductor device 200, an insulating film may be further laminated between the semiconductor substrate 210 and the porous metal oxide film 280. In addition, in the semiconductor device 200, a semiconductor film or a metal film may be further laminated between the semiconductor substrate 210 and the porous metal oxide film 280.

Figure 12:
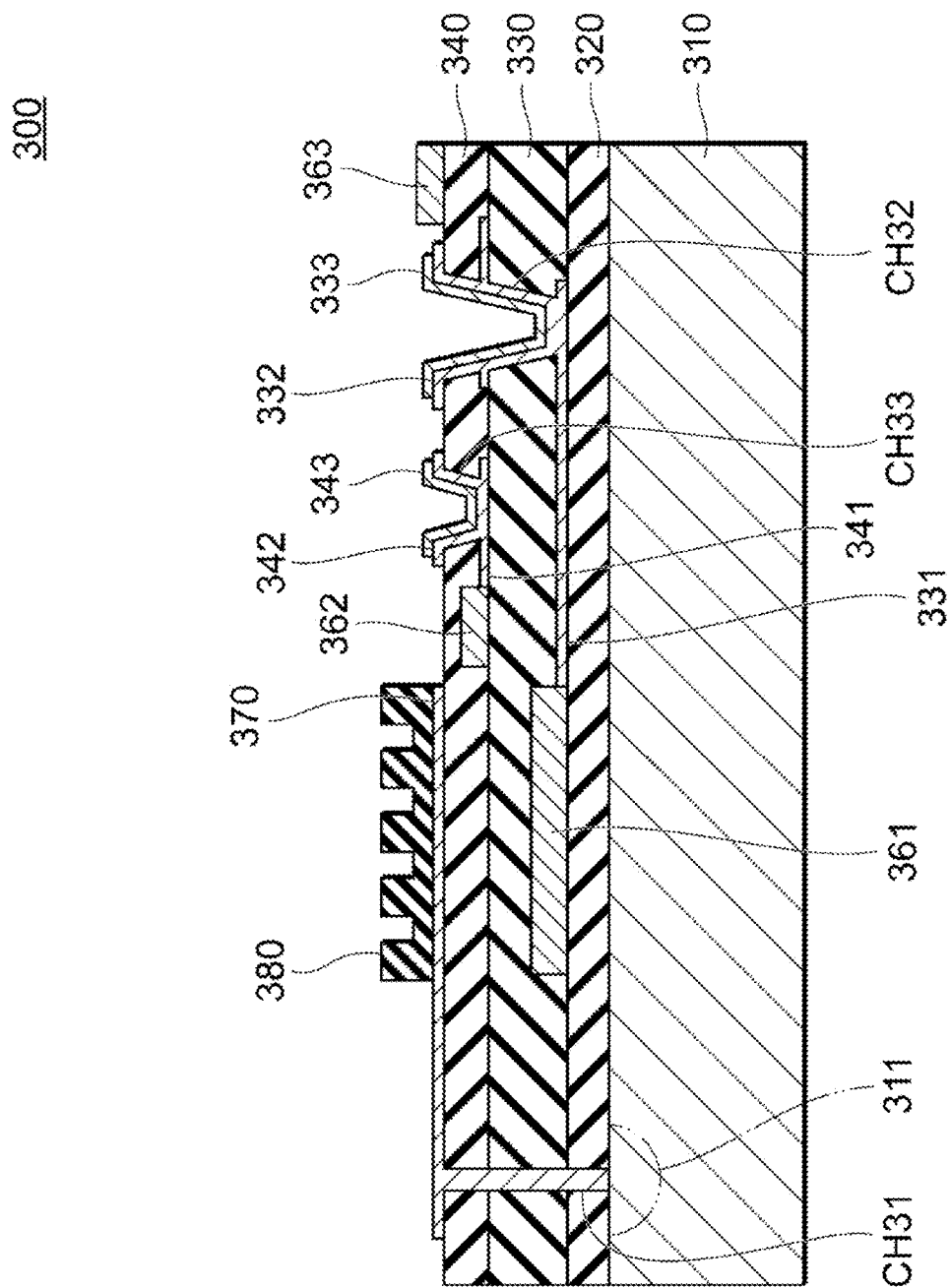
FIG. 12 is a cross-sectional view schematically illustrating the configuration of a semiconductor device according to a third embodiment.

Next, the configuration of a semiconductor device 300 according to the third embodiment will be described with reference to FIG. 12. FIG. 12 is a cross-sectional view schematically illustrating the configuration of the semiconductor device according to the third embodiment.

The semiconductor device 300 according to the third embodiment includes a semiconductor substrate 310, insulating films 320, 330, and 340, a power supply line 370, a porous metal oxide film 380, signal lines 331, 332, 341, and 342, electrode pads 333 and 343, and an element 361, as with the semiconductor device 200. Furthermore, the semiconductor substrate 310 is provided with a connection 311, and the power supply line 370 is electrically connected to the semiconductor substrate 310 through a through hole CH31. The insulating film 330 has a through hole CH32 formed therein, and the insulating film 340 has a through hole CH33 formed therein.

The semiconductor device 300 according to the third embodiment is different from the semiconductor device 200 in that the semiconductor device 300 includes elements 362 and 363. The element 362 is provided between the insulating film 330 and the insulating film 340, and electrically connected to the signal lines 341.

The element 363 is provided on the insulating film 340. As shown in FIG. 12, in the case of the first main surface 310A of the semiconductor substrate 310 in planar view, the elements 362 and 363 may be provided outside the porous metal oxide film 380. This semiconductor device 300 can also achieve the same advantageous effect as that of the semiconductor device 200.

Figure 13:
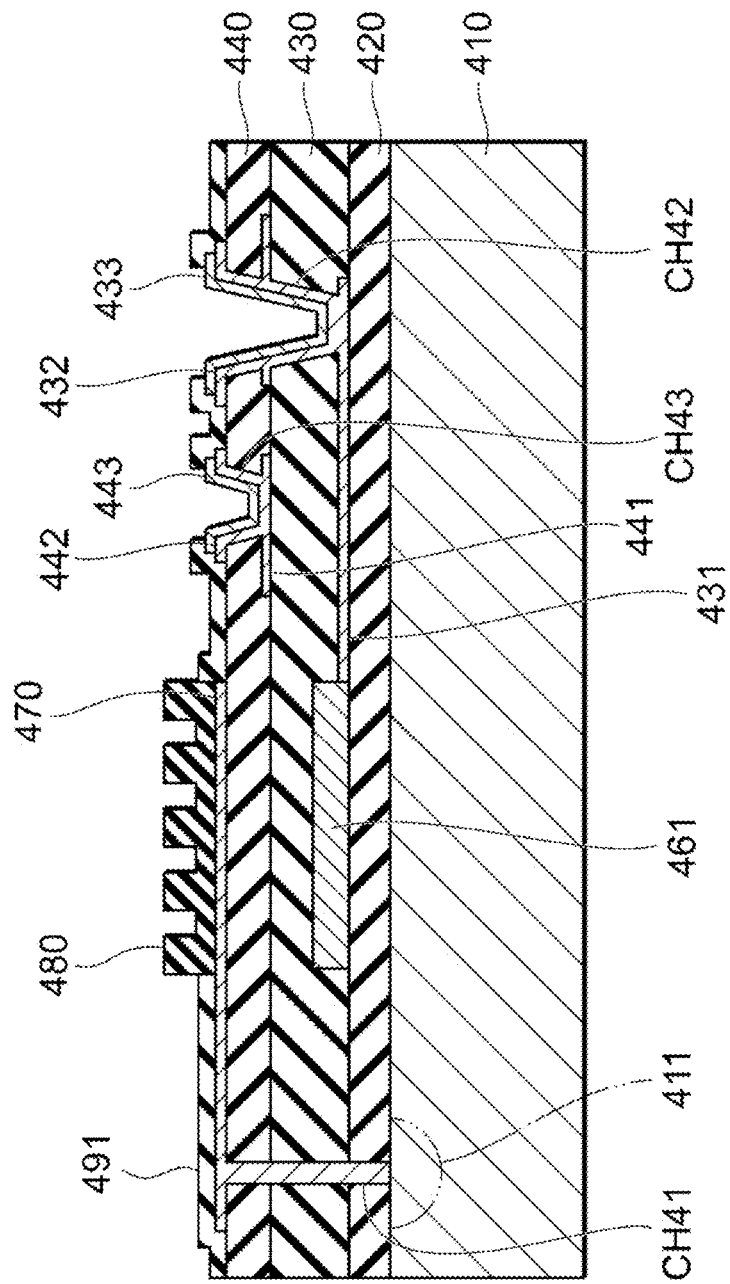
FIG. 13 is a cross-sectional view schematically illustrating the configuration of a semiconductor device according to a fourth embodiment.

Next, the configuration of a semiconductor device 400 according to the fourth embodiment will be described with reference to FIG. 13. FIG. 13 is a cross-sectional view schematically illustrating the configuration of the semiconductor device according to the fourth embodiment.

The semiconductor device 400 according to the fourth embodiment includes a semiconductor substrate 410, insulating films 420, 430, and 440, a power supply line 470, a porous metal oxide film 480, signal lines 431, 432, 441, and 442, electrode pads 433 and 443, and an element 461, as with the semiconductor device 200. Furthermore, the semiconductor substrate 410 is provided with a connection 411, and the power supply line 470 is electrically connected to the semiconductor substrate 410 through a through hole CH41. The insulating film 430 has a through hole CH42 formed therein, and the insulating film 440 has a through hole CH43 formed therein.

The semiconductor device 400 according to the fourth embodiment is different from the semiconductor device 200 in that the semiconductor device 400 further includes a protective film 491 that covers at least a part of an end of the porous metal oxide film 480. This difference allows the protective film 491 to suppress the ingress of moisture into the semiconductor device 400, and suppress degradation of the semiconductor device 400.

Figure 14:
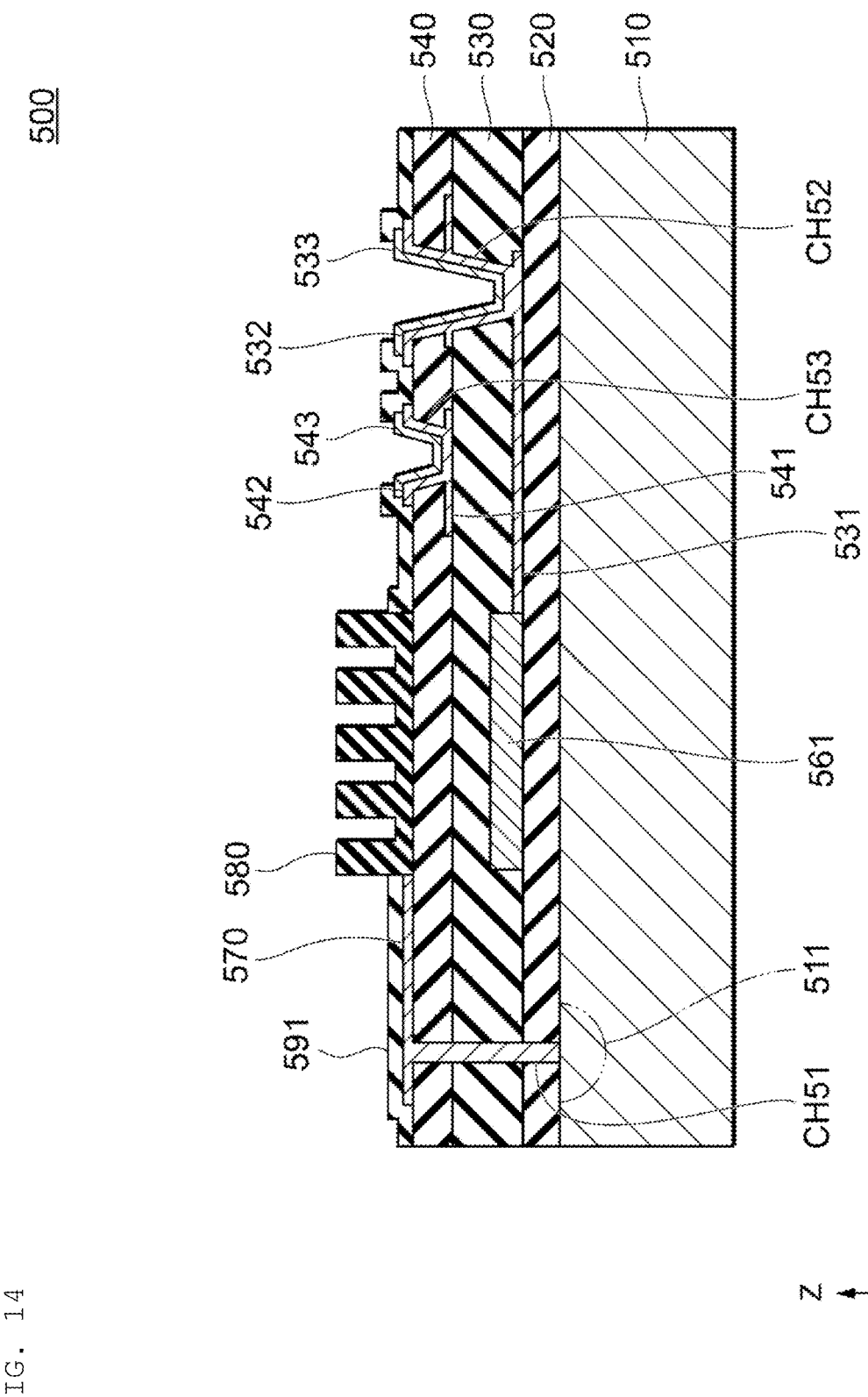
FIG. 14 is a cross-sectional view schematically illustrating the configuration of a semiconductor device according to a fifth embodiment.

Next, the configuration of a semiconductor device 500 according to the fifth embodiment will be described with reference to FIG. 14. FIG. 14 is a cross-sectional view schematically illustrating the configuration of the semiconductor device according to the fifth embodiment.

The semiconductor device 500 according to the fifth embodiment includes a semiconductor substrate 510, insulating films 520, 530, and 540, a power supply line 570, a porous metal oxide film 580, signal lines 531, 532, 541, and 542, electrode pads 533 and 543, and an element 561, as with the semiconductor device 200. Furthermore, the semiconductor substrate 510 is provided with a connection 511, and the power supply line 570 is electrically connected to the semiconductor substrate 510 through a through hole CH51. The insulating film 530 has a through hole CH52 formed therein, and the insulating film 540 has a through hole CH53 formed therein.

The semiconductor device 500 according to the fifth embodiment is different from the semiconductor device 200 in that the power supply line 570 has contact with an end of the porous metal oxide film 580.

The porous metal oxide film 580 has contact with, for example, the insulating film 540. This contact allows the surface area of the porous metal oxide film 580 to be increased. This porous metal oxide film 580 can be formed, for example, by anodizing a part of the power supply line 570 as an anodized film. More specifically, the porous metal oxide film 580 includes an oxide of the metal material included in the power supply line 570.

Thus, the manufacturing process for the semiconductor device 500 can be simplified by omitting the step of forming a film to be anodized.

Figure 15:
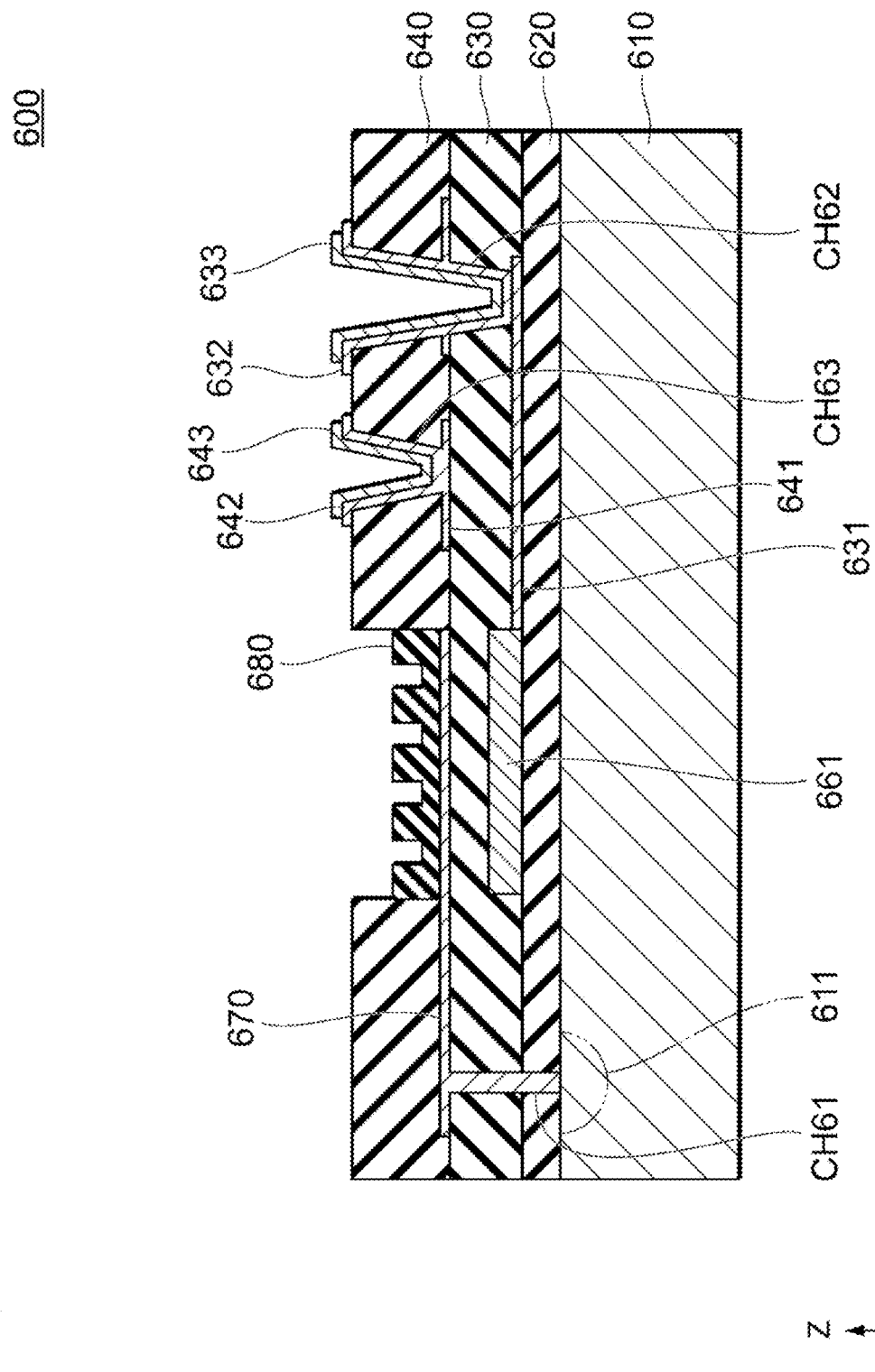
FIG. 15 is a cross-sectional view schematically illustrating the configuration of a semiconductor device according to a sixth embodiment.

Next, the configuration of a semiconductor device 600 according to the sixth embodiment will be described with reference to FIG. 15. FIG. 15 is a cross-sectional view schematically illustrating the configuration of the semiconductor device according to the sixth embodiment.

The semiconductor device 600 according to the sixth embodiment includes a semiconductor substrate 610, insulating films 620, 630, and 640, a power supply line 670, a porous metal oxide film 680, signal lines 631, 632, 641, and 642, electrode pads 633 and 643, and an element 661, as with the semiconductor device 200. Furthermore, the semiconductor substrate 610 is provided with a connection 611, and the power supply line 670 is electrically connected to the semiconductor substrate 610 through a through hole CH61. The insulating film 630 has a through hole CH62 formed therein, and the insulating film 640 has a through hole CH63 formed therein.

The semiconductor device 600 according to the sixth embodiment is different from the semiconductor device 200 in that the power supply line 670 is provided between the insulating film 630 and the insulating film 640, and in that the porous metal oxide film 680 and the insulating film 640 are arranged in a direction parallel to the XY plane. In this regard, the power supply line 670 and the signal line 641 correspond to a first metal film provided on the side of the insulating film 630 (corresponding to a first insulating film), opposite to the semiconductor substrate 610. Furthermore, the signal line 632 and the signal line 642 correspond to a second metal film provided on the side of the insulating film 640 (corresponding to a second insulating film), opposite to the semiconductor substrate 610. In the semiconductor device 600 according to the present embodiment, elements, circuits, and the like can be integrated in a layer that is farther from the semiconductor substrate 610 than the porous metal oxide film 680 is. It is to be noted that the porous metal oxide film 680 may constitute an element such as a capacitor, and may be covered with the insulating film 640.

Figure 16:
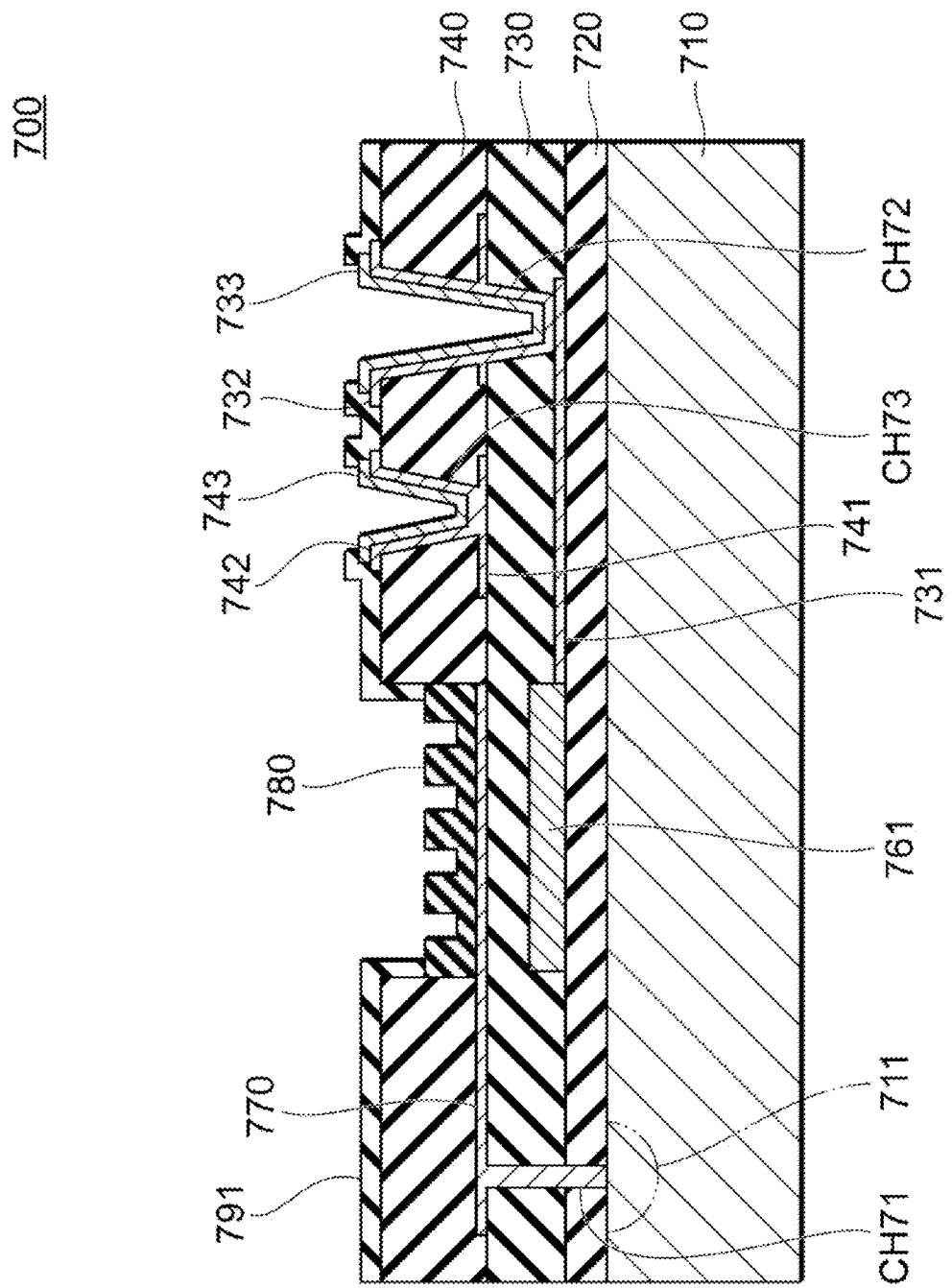
FIG. 16 is a cross-sectional view schematically illustrating the configuration of a semiconductor device according to a seventh embodiment.

Next, the configuration of a semiconductor device 700 according to the seventh embodiment will be described with reference to FIG. 16. FIG. 16 is a cross-sectional view schematically illustrating the configuration of the semiconductor device according to the seventh embodiment.

The semiconductor device 700 according to the seventh embodiment includes a semiconductor substrate 710, insulating films 720, 730, and 740, a power supply line 770, a porous metal oxide film 780, signal lines 731, 732, 741, and 742, electrode pads 733 and 743, and an element 761, as with the semiconductor device 600. Furthermore, the semiconductor substrate 710 is provided with a connection 711, and the power supply line 770 is electrically connected to the semiconductor substrate 710 through a through hole CH71. The insulating film 730 has a through hole CH72 formed therein, and the insulating film 740 has a through hole CH73 formed therein.

The semiconductor device 700 according to the seventh embodiment is different from the semiconductor device 600 in that the semiconductor device 700 further includes a protective film 791 that covers the insulating film 740 (corresponding to a second insulating film). The protective film 791 covers the inner surface of an opening region of the insulating film 740, opposite to the porous metal oxide film 780. This coverage allows the protective film 791 to suppress the ingress of moisture into the semiconductor device 700, and suppress degradation of the semiconductor device 700.

Figure 17:
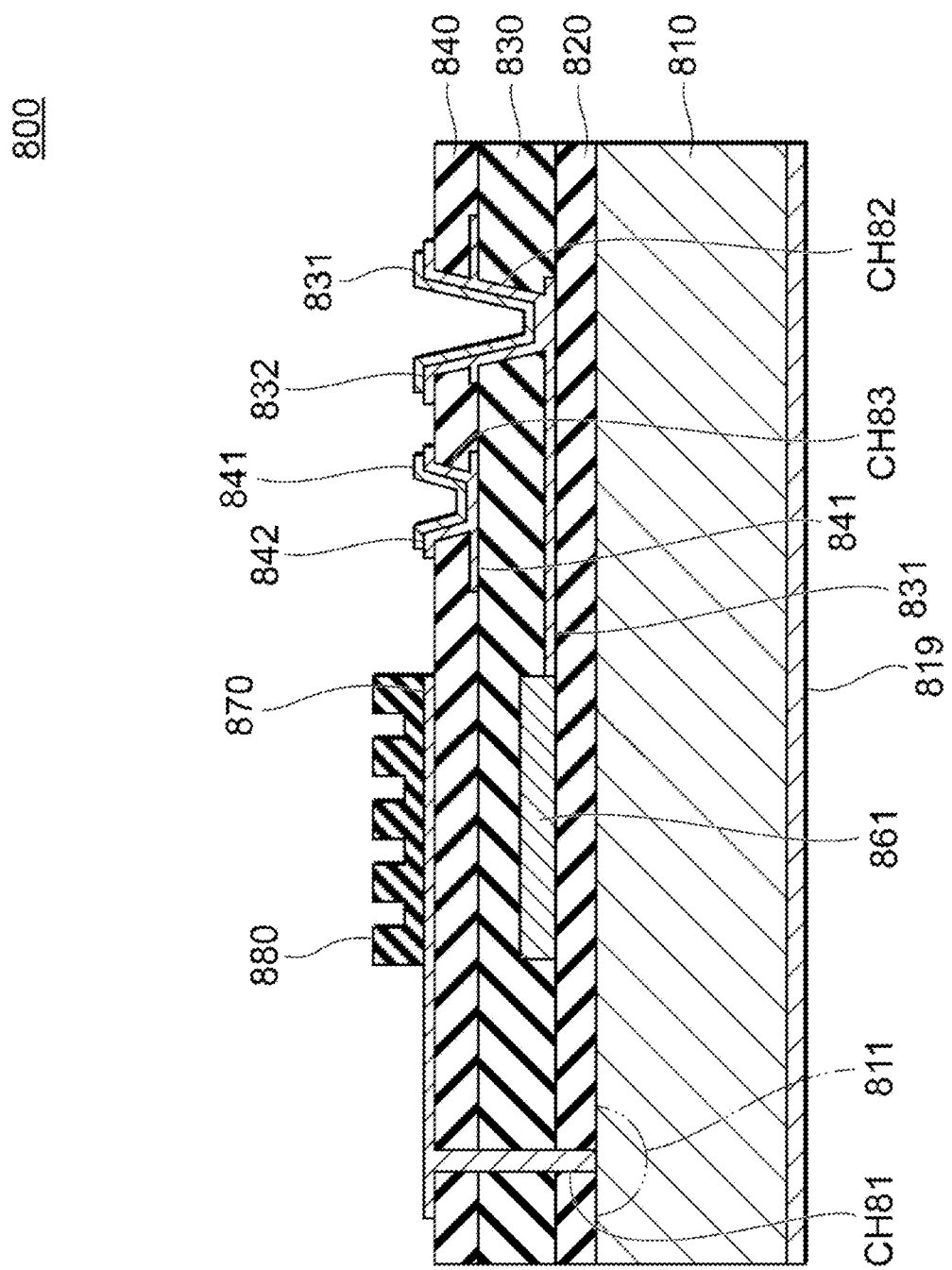
FIG. 17 is a cross-sectional view schematically illustrating the configuration of a semiconductor device according to an eighth embodiment.

Next, the configuration of a semiconductor device 800 according to the eighth embodiment will be described with reference to FIG. 17. FIG. 17 is a cross-sectional view schematically illustrating the configuration of the semiconductor device according to the eighth embodiment.

The semiconductor device 800 according to the eighth embodiment includes a semiconductor substrate 810, insulating films 820, 830, and 840, a power supply line 870, a porous metal oxide film 880, signal lines 831, 832, 841, and 842, electrode pads 833 and 843, and an element 861, as with the semiconductor device 200. Furthermore, the semiconductor substrate 810 is provided with a connection 811, and the power supply line 870 is electrically connected to the semiconductor substrate 810 through a through hole CH81. The insulating film 830 has a through hole CH82 formed therein, and the insulating film 840 has a through hole CH83 formed therein.

The semiconductor device 800 according to the eighth embodiment is different from the semiconductor device 200 in that the semiconductor device 800 further includes a back metal film 819 on the second main surface 810B of the semiconductor substrate 810. This difference allows the contact resistance between the power supply jig and the semiconductor substrate 810 to be reduced in anodization. More specifically, power loss in the manufacturing process for the semiconductor device 800 can be reduced, thereby reducing variations in the pore density and size of the porous metal oxide film 880.

Figure 18A:
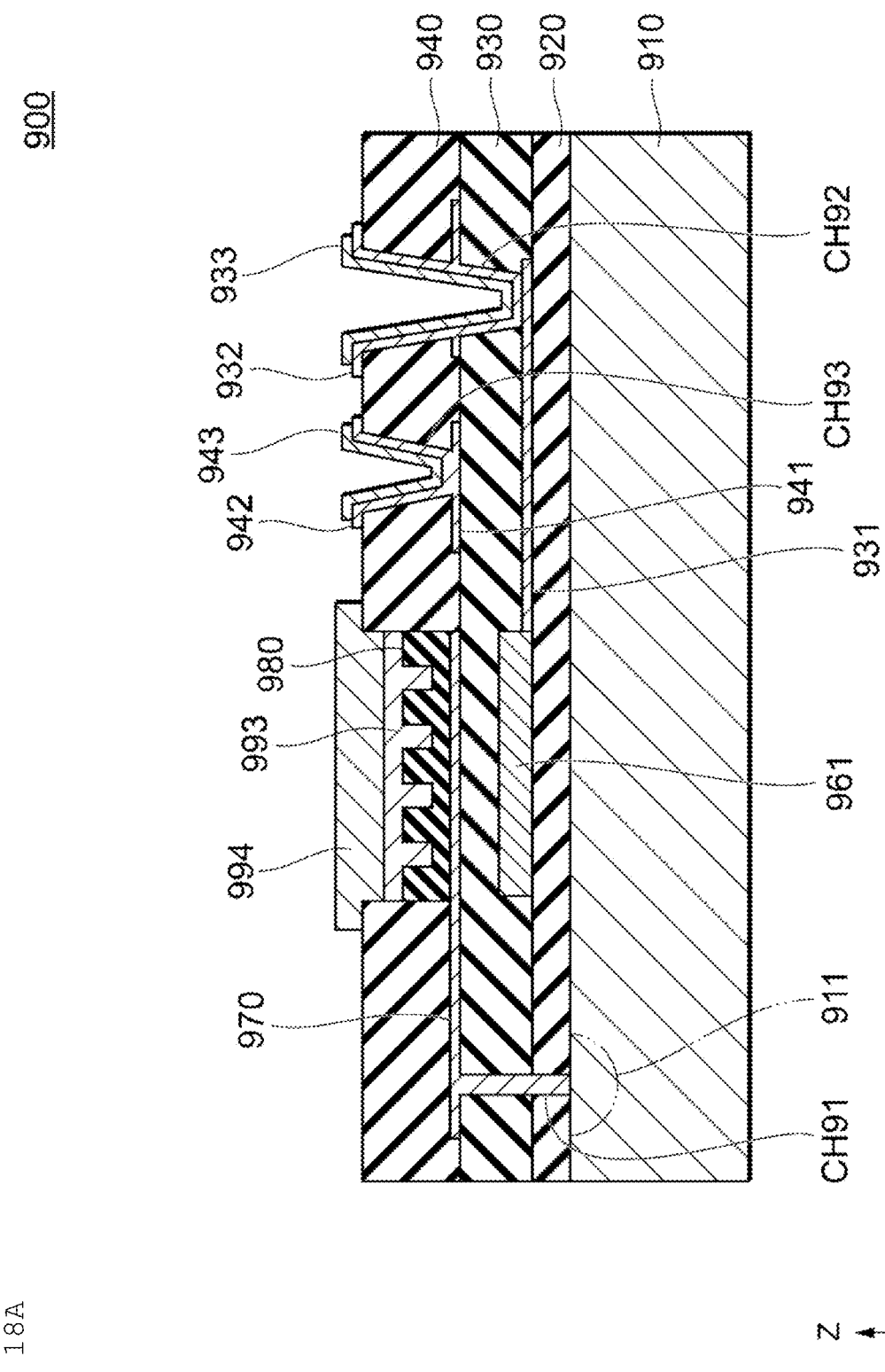
FIG. 18A is a cross-sectional view schematically illustrating the configuration of a semiconductor device according to a ninth embodiment.
Figure 18B:
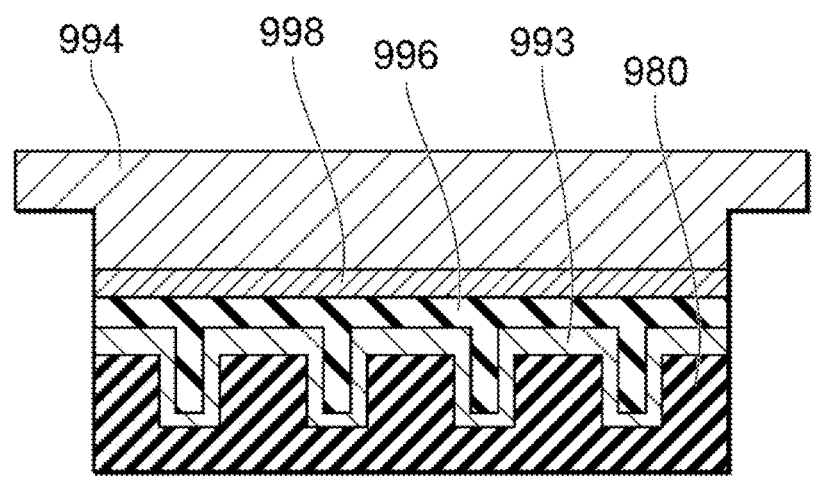
FIG. 18B is a cross-sectional view schematically illustrating another configuration example of a capacitor in the semiconductor device according to the ninth embodiment.
Figure 18B:
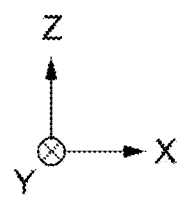

Next, the configuration of a semiconductor device 900 according to the ninth embodiment will be described with reference to FIGS. 18A and 18B. FIG. 18A is a cross-sectional view schematically illustrating the configuration of the semiconductor device according to the ninth embodiment. FIG. 18B is a cross-sectional view schematically illustrating another configuration example of a capacitor in the semiconductor device according to the ninth embodiment.

The semiconductor device 900 according to the ninth embodiment includes a semiconductor substrate 910, insulating films 920, 930, and 940, a power supply line 970, a porous metal oxide film 980, signal lines 931, 932, 941, and 942, electrode pads 933 and 943, and an element 961, as with the semiconductor device 600. Furthermore, the semiconductor substrate 910 is provided with a connection 911, and the power supply line 970 is electrically connected to the semiconductor substrate 910 through a through hole CH91. The insulating film 930 has a through hole CH92 formed therein, and the insulating film 940 has a through hole CH93 formed therein.

The semiconductor device 900 according to the ninth embodiment as shown in FIG. 18A is different from the semiconductor device 600 in that the semiconductor device 900 further includes a capacitor electrode 993 that forms capacitance between the capacitor electrode 993 and the power supply line 970 with the porous metal oxide film 980 as a dielectric film.

The capacitor electrode 993 is provided on the side of the porous metal oxide film 980, opposite to the semiconductor substrate 910, and extends inside a plurality of pores of the porous metal oxide film 980. The semiconductor device 900 according to the present embodiment allows the opposed area of the opposed electrode of the capacitor to be increased. More specifically, in the semiconductor device 900, the capacitance formed by the power supply line 970 and the capacitor electrode 993 can be increased. On the capacitor electrode 993, an electrode pad 994 is provided. The electrode pad 994 is, as with the electrode pad 933 and the electrode pad 943, an external terminal electrically connected to an external circuit, which is, for example, a bonding pad for wire bonding. A voltage is applied to the capacitor electrode 993 through the electrode pad 994. It is to be noted that the electrode pad 994 may be omitted. More specifically, a voltage may be applied to the capacitor electrode 993 through wiring formed in the semiconductor device 900.

As shown in FIG. 18B, the semiconductor device 900 according to the ninth embodiment may further include a dielectric film 996 and a capacitor electrode 998 on the capacitor electrode 993. The capacitor electrode 993 corresponds to a first capacitor electrode.

Between the capacitor electrode 993 and the capacitor electrode 998, capacitance is formed. The capacitor electrode 998 corresponds to a second capacitor electrode. The dielectric film 996 is provided on the side of the capacitor electrode 993, opposite to the semiconductor substrate 910, and extends inside the plurality of pores of the porous metal oxide film 980. In other words, the dielectric film 996 is opposed to the porous metal oxide film 980 with the capacitor electrode 993 interposed therebetween, and extends along the inner wall of the plurality of pores of the porous metal oxide film 980. The capacitor electrode 998 is provided on the side of the dielectric film 996, opposite to the semiconductor substrate 910, and opposed to the capacitor electrode 993 with the dielectric film 996 interposed therebetween. The electrode pad 994 is provided on the capacitor electrode 998. The dielectric constant and thickness of the dielectric film 996 can be changed. For this reason, in the semiconductor device 900, the magnitude of the capacitance can be suitably adjusted while increasing the capacitance formed by the capacitor electrode 993 and the capacitor electrode 998.

Figure 19:
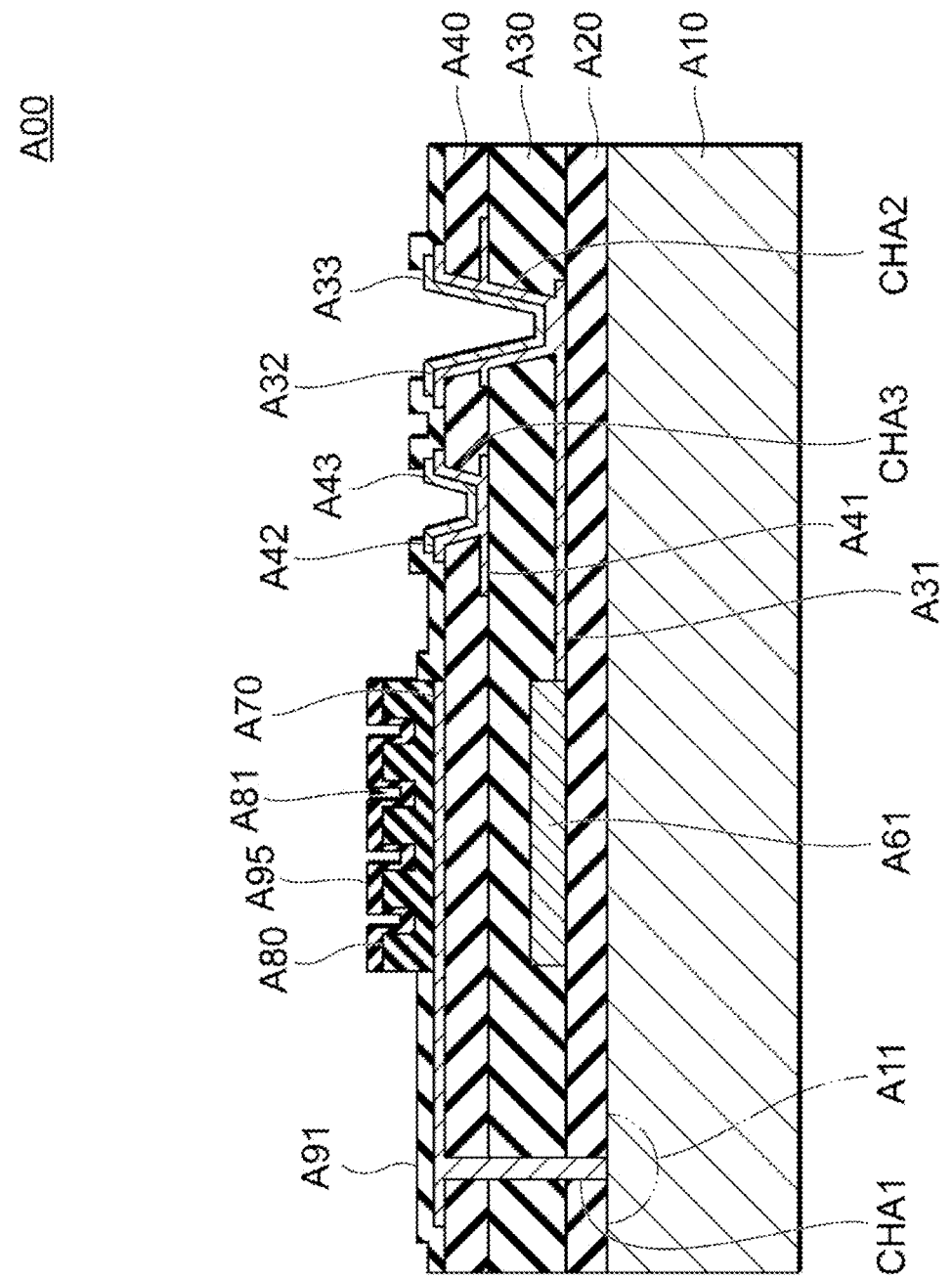
FIG. 19 is a cross-sectional view schematically illustrating the configuration of a semiconductor device according to a tenth embodiment.

Next, the configuration of a semiconductor device A00 according to the tenth embodiment will be described with reference to FIG. 19. FIG. 19 is a cross-sectional view schematically illustrating the configuration of the semiconductor device according to the tenth embodiment.

The semiconductor device A00 according to the eleventh embodiment includes a semiconductor substrate A10, insulating films A20, A30, and A40, a power supply line A70, a porous metal oxide film A80, signal lines A31, A32, A41, and A42, electrode pads A33 and A43, an element A61, and a protective film A91, as with the semiconductor device 400. Furthermore, the semiconductor substrate A10 is provided with a connection A11, and the power supply line A70 is electrically connected to the semiconductor substrate A10 through a through hole CHA1. The insulating film A30 has a through hole CHA2 formed therein, and the insulating film A40 has a through hole CHA3 formed therein.

The semiconductor device A00 according to the eleventh embodiment is different from the semiconductor device 400 in that a catalyst film A95 is further provided. The catalyst film A95 is provided on the side of the porous metal oxide film A80, opposite to the semiconductor substrate A10, and adsorbs a gas. The element A61 has a gas detection element disposed for detecting a temperature change based on the amount of gas adsorbed on the catalyst film A95. This makes it possible to provide the semiconductor device A00 which has a gas detection function.

The element A61 (gas detection element) is, for example, a circuit that measures a change in the electrical resistivity of a resistor based on a temperature change. As such an element A61, for example, a Wheatstone bridge circuit can be used. This circuit has power supply and current detection means incorporated therein, thereby allowing a change in electrical resistivity to be measured. The element A61 (gas detection element) may be a semiconductor temperature sensor that detects a temperature change as a change in electrical characteristics. As such an element A61, for example, a semiconductor element such as an FET or a TFT can be used. This element allows the temperature change to be detected with higher sensitivity.

The element A61 may be, for example, a gas detection element that detects combustion heat in the case of burning the gas adsorbed on the catalyst film A95. The element A61 may be a gas detection element that detects reaction heat in the case of adsorption of the gas on the catalyst film A95 or desorption of the gas from the catalyst film A95. The element A61 (gas detection element) is provided between the semiconductor substrate A10 and the porous metal oxide film A80.

This allows the sensitivity of the gas detection element to be improved.

Further, in the example shown in FIG. 19, the catalyst film A95 is a continuous thin film extending along the inside surface of a plurality of pores A81 of the porous metal oxide film A80. Then, the surface area of the porous metal oxide film A80 is increased, thus allowing the surface area of the catalyst film A95 to be increased. Accordingly, the sensitivity of the gas detection element can be improved.

Figure 20:
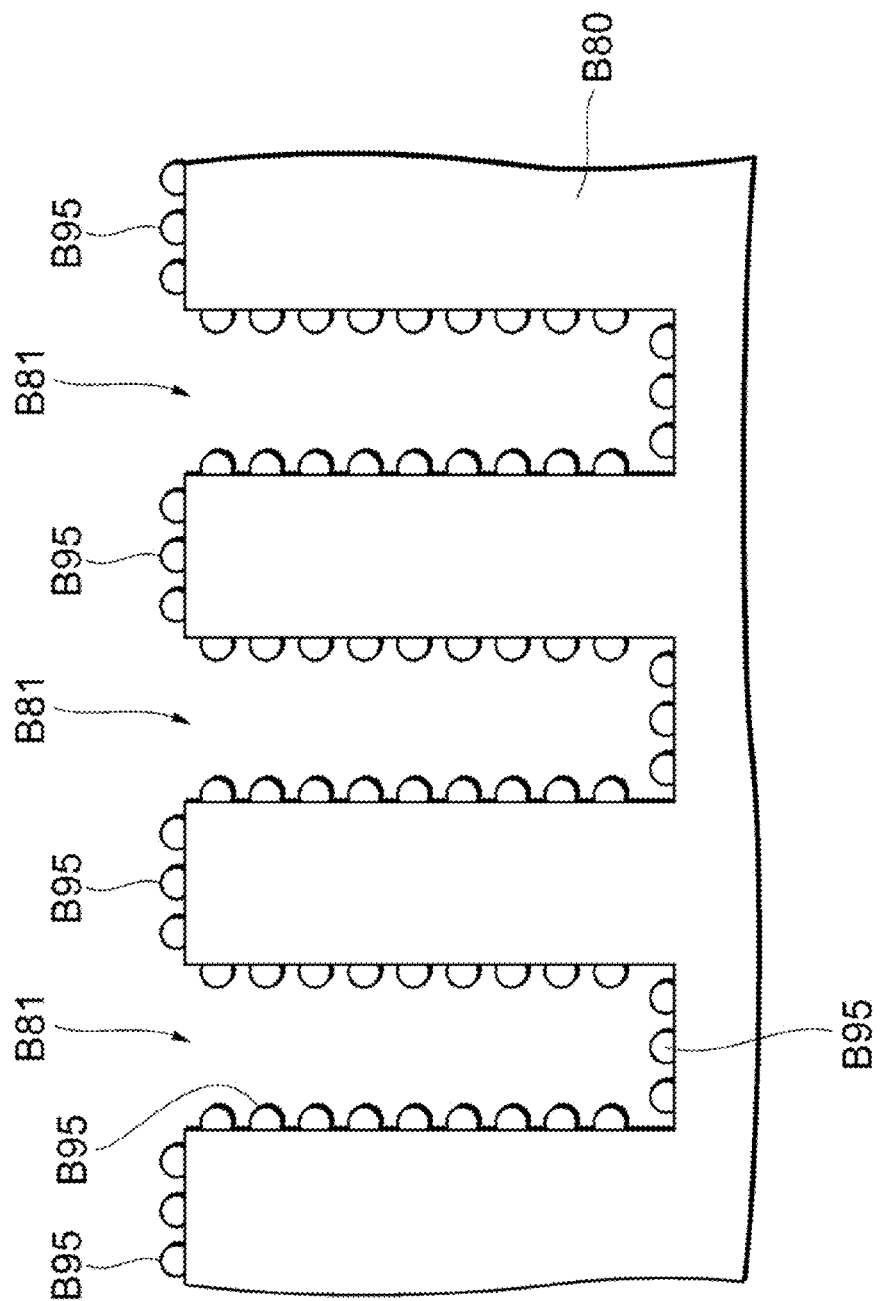
FIG. 20 is a cross-sectional view schematically illustrating the configuration of a catalyst film of a semiconductor device according to an eleventh embodiment.

Next, the configuration of a catalyst film B95 for the semiconductor device according to the eleventh embodiment will be described with reference to FIG. 20. FIG. 20 is a cross-sectional view schematically illustrating the configuration of the catalyst film of the semiconductor device according to the eleventh embodiment.

The catalyst film B95 of the semiconductor device according to the twelfth embodiment is different from the catalyst film A95 in that the catalyst film B95 is formed in a plurality of island shapes on the inside surface of a plurality of pores B81 of a porous metal oxide film B80. The catalyst film B95 according to the present embodiment allows the surface area to be increased more than that of the catalyst film A95 of the semiconductor device according to the eleventh embodiment.

Figure 21:
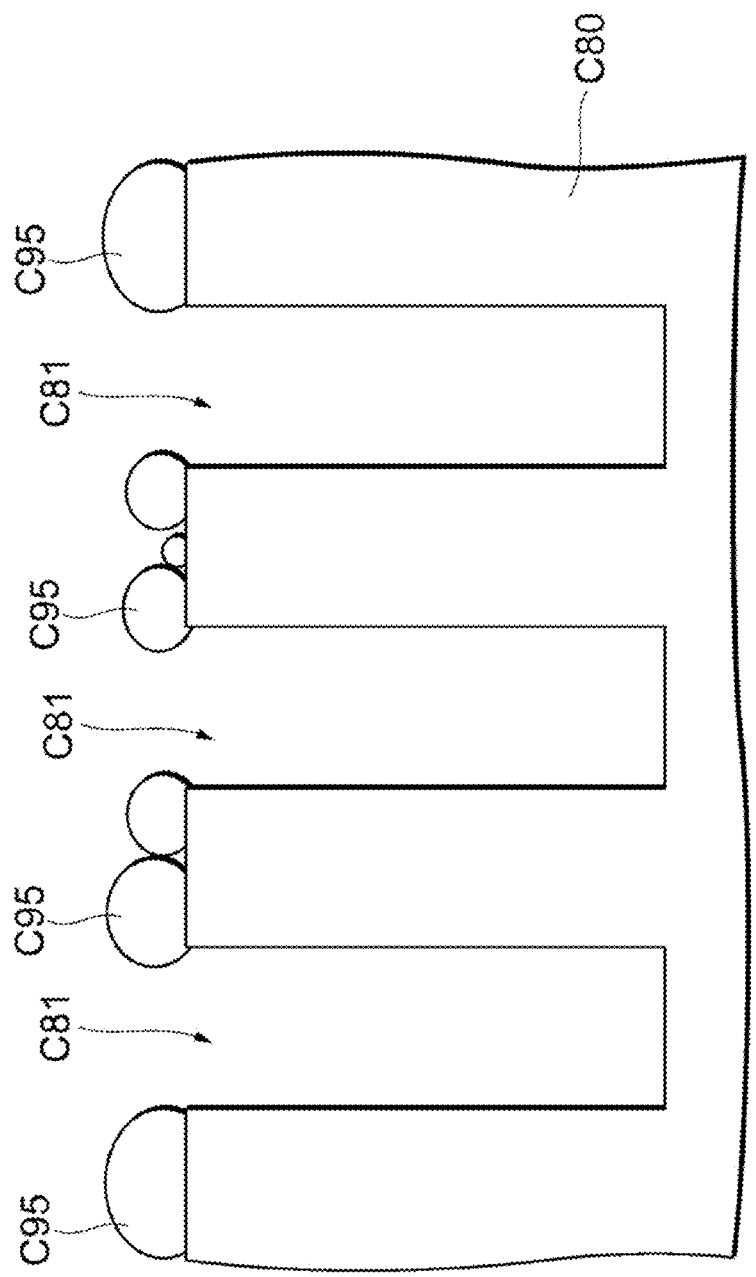
FIG. 21 is a cross-sectional view schematically illustrating the configuration of a catalyst film of a semiconductor device according to a twelfth embodiment.

Next, the configuration of a catalyst film C95 for the semiconductor device according to the twelfth embodiment will be described with reference to FIG. 21. FIG. 21 is a cross-sectional view schematically illustrating the configuration of the catalyst film of the semiconductor device according to the twelfth embodiment.

The catalyst film C95 of the semiconductor device according to the twelfth embodiment is different from the catalyst film A95 in that the catalyst film C95 is formed in a plurality of island shapes on the outer surface of a plurality of pores C81 of a porous metal oxide film C80. In the case of providing the catalyst film C95 in a coating step, the porous metal oxide film C80 limits spreading of the catalyst film C95 due to surface tension, and the catalyst film C95 is formed in island shapes at the tips of protrusions between the plurality of pores C81. This allows the surface area of the catalyst film C95 to be increased, as compared with the catalyst film provided in the form of a thin film on a plane surface.

Figure 22:
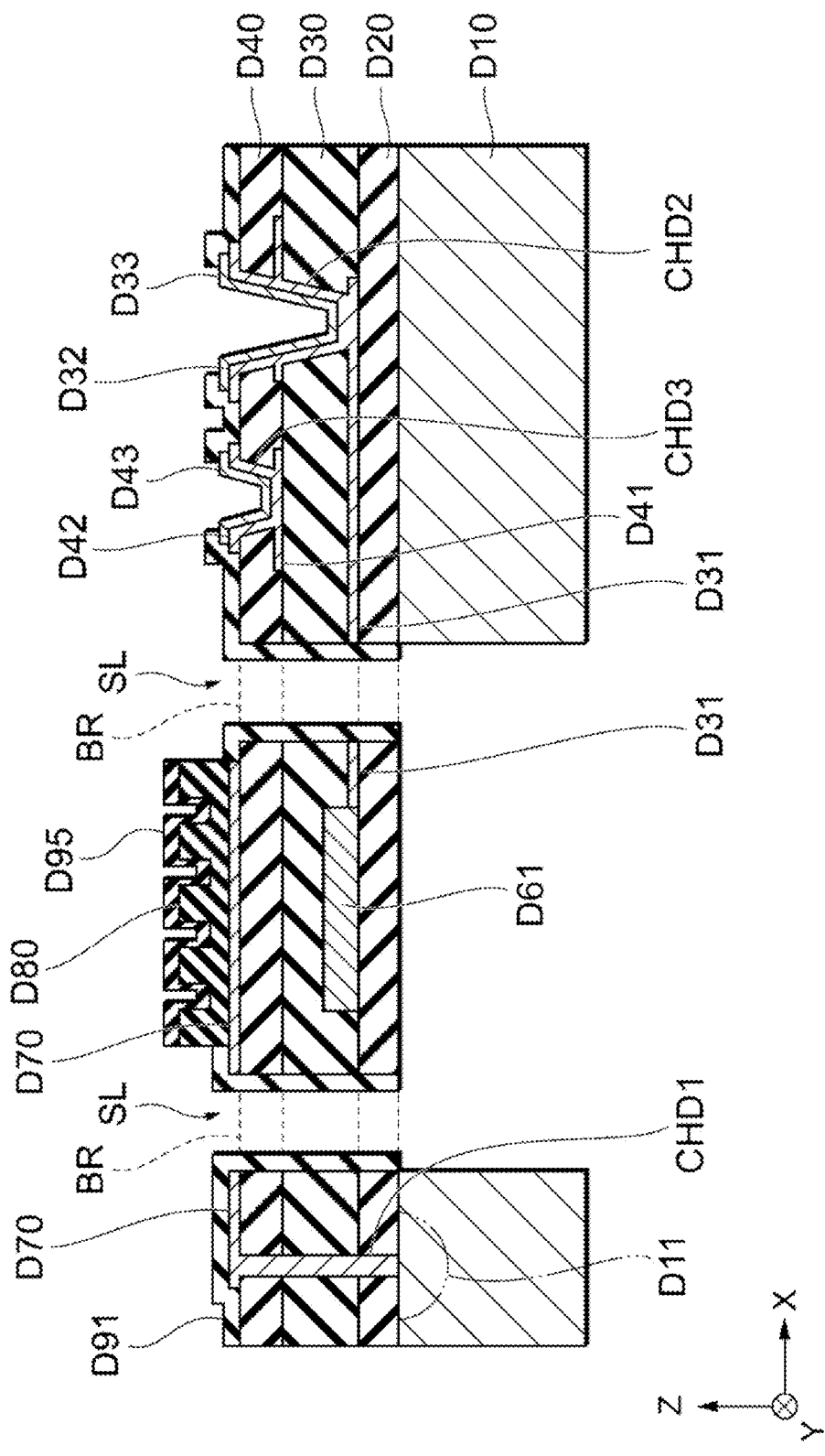
FIG. 22 is a cross-sectional view schematically illustrating the configuration of a semiconductor device according to a thirteenth embodiment.

Next, the configuration of a semiconductor device D00 according to the thirteenth embodiment will be described with reference to FIG. 22. FIG. 22 is a cross-sectional view schematically illustrating the configuration of the semiconductor device according to the thirteenth embodiment.

The semiconductor device D00 according to the thirteenth embodiment includes a semiconductor substrate D10, insulating films D20, D30, and D40, a power supply line D70, a porous metal oxide film D80, signal lines D31, D32, D41, and D42, electrode pads D33 and D43, an element D61, a protective film D91, and a catalyst film D95, as with the semiconductor device A00. Furthermore, the semiconductor substrate D10 is provided with a connection D11, and the power supply line D70 is electrically connected to the semiconductor substrate D10 through a through hole CHD1. The insulating film D30 has a through hole CHD2 formed therein, and the insulating film D40 has a through hole CHD3 formed therein.

The semiconductor device D00 according to the thirteenth embodiment is different from the semiconductor device A00 in that a region of the semiconductor substrate D10, opposed to the porous metal oxide film D80, is at least partially removed. This difference allows the heat transfer path to be reduced, thereby reducing the heat capacity around the element D61 (gas detection element) and the catalyst film D95. Thus, the sensitivity of the gas detection element can be improved.

In addition, the insulating films D20, D30, and D40 have slits SL formed around the porous metal oxide film D80. The region inside the slits SL, including the element D61 (gas detection element) and the catalyst film D95, is coupled and held by bridges BR with respect to the regions outside the slits SL. The wirings such as the power supply line D70 and the signal line D31 are connected through the bridge BR. The slits SL are formed, thereby making it possible to reduce the heat transfer path, and then reduce the heat capacity around the element D61 (gas detection element) and the catalyst film D95.

Figure 23:
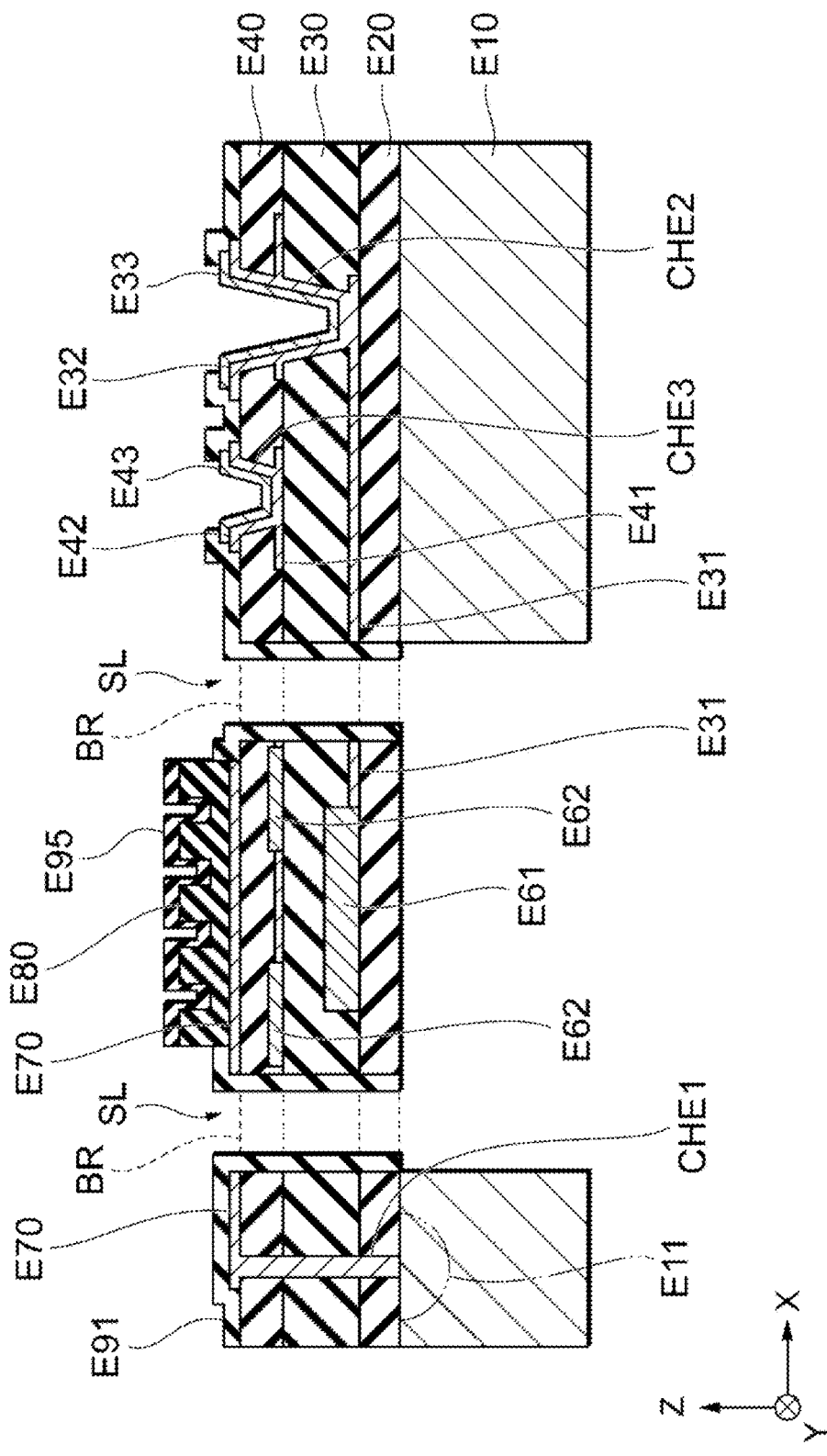
FIG. 23 is a cross-sectional view schematically illustrating the configuration of a semiconductor device according to a fourteenth embodiment.

Next, the configuration of a semiconductor device E00 according to the fourteenth embodiment will be described with reference to FIG. 23. FIG. 23 is a cross-sectional view schematically illustrating the configuration of the semiconductor device according to the fourteenth embodiment.

The semiconductor device E00 according to the fourteenth embodiment includes a semiconductor substrate E10, insulating films E20, E30, and E40, a power supply line E70, a porous metal oxide film E80, signal lines E31, E32, E41, and E42, electrode pads E33 and E43, an element E61, a protective film E91, and a catalyst film E95, as with the semiconductor device A00. Furthermore, the semiconductor substrate E10 is provided with a connection E11, and the power supply line E70 is electrically connected to the semiconductor substrate E10 through a through hole CHE1. The insulating film E30 has a through hole CHE2 formed therein, and the insulating film E40 has a through hole CHE3 formed therein.

The semiconductor device E00 according to the fourteenth embodiment is different from the semiconductor device A00 in that the semiconductor device E00 includes an element E62. The element E62 is a heating element that is capable of heating the catalyst film E95. The heating element is, for example, a heater wire that converts electricity into heat. The element E62 (heating element) is capable of burning the gas adsorbed on the catalyst film E95. Alternatively, the element E62 (heating element) is capable of promoting an adsorption reaction or a desorption reaction between the catalyst film E95 and a gas. More specifically, the sensitivity of the element E61 (gas detection element) can be improved. The element E62 (heating element) is provided between the element E61 (gas detection element)

and the porous metal oxide film E80. This allows the catalyst film E95 to be efficiently heated by the element E62 (heating element).

As described above, according to one aspect of the present invention, the semiconductor device 100 is provided, which includes the semiconductor substrate 110 with the first main surface 110A and the second main surface 110B opposed to each other, and the porous metal oxide film 180 with a plurality of pores 181 on the side of the first main surface 110A of the semiconductor substrate 110. The semiconductor substrate 110 has the connection 111 electrically connected to the porous metal oxide film 180, and the semiconductor substrate 110 is configured to provide a power supply path from the second main surface 110B to the connection 111 on the first main surface 110A.

According to the aspect mentioned above, in the manufacturing process for the semiconductor device, for example, there is no need to provide the power supply pad or the power supply line on the side closer to the first main surface of the semiconductor substrate wafer, thus making it possible to increase the number of semiconductor devices that can be manufactured per semiconductor substrate wafer. Furthermore, the semiconductor device according to the present embodiment is capable of reducing variations in formation voltage, due to differences in length between respective power supply lines that supply the formation voltage to respective films to be anodized. More specifically, the semiconductor device is capable of reducing variations in pore density and size between a plurality of porous metal oxide films formed on the same semiconductor substrate wafer. From the foregoing, it is possible to provide the semiconductor device which capable of improving the manufacturing efficiency. Furthermore, the semiconductor device according to the present embodiment is capable of improving the adhesion strength of the porous metal oxide film, as compared with the configuration of a formed porous metal oxide film provided by transfer for the semiconductor device. Thus, it is possible to improve the reliability of the semiconductor device.

The plurality of pores 181 may be opened toward the side opposite to the semiconductor substrate 110, and may extend in a direction that intersects with the first main surface 110A of the semiconductor substrate 110. This allows the surface area of the porous metal oxide film on the side opposite to the semiconductor substrate to be increased.

The semiconductor device 100 may further include the first insulating film 120 between the semiconductor substrate 110 and the porous metal oxide film 180, with the through hole CH11 formed therein, such that the porous metal oxide film 180 may be electrically connected to the connection 111 through the through hole CH11 of the first insulating film 120. In the semiconductor device 100 according to the present embodiment, even if an insulating film is provided between the semiconductor substrate and the porous metal oxide film, the porous metal oxide film can be formed by power supply from the side of the second main surface of the semiconductor substrate. The insulating film may be omitted. More specifically, the porous metal oxide film may be provided on the semiconductor substrate, or on the semiconductor layer of the multilayer substrate.

The electrical resistivity of the semiconductor substrate 110 may be 100 Ω·cm or less.

This resistivity allows power loss within the semiconductor substrate to be reduced in applying a formation voltage with an external terminal connected to the second main surface of the semiconductor substrate. Thus, it is possible to reduce variations in the pore density and size of the porous metal oxide film based on the position of each semiconductor substrate in the semiconductor substrate wafer.

The connection 111 may have a high-concentration region that is higher in impurity concentration than the area surrounding the high-concentration region. This allows the interface between the semiconductor substrate and the power supply line to be brought into ohmic contact. More specifically, in the semiconductor device according to the present embodiment, power loss at the interface between the semiconductor substrate and the power supply line can be reduced.

The semiconductor device 100 may further include a first metal film including the power supply line 170 that electrically connects the connection 111 and the porous metal oxide film 180. This allows the connection to be provided outside the porous metal oxide film in the case of the first main surface of the semiconductor substrate in planar view. Thus, elements, circuits, and the like can be provided between the semiconductor substrate and the porous metal oxide film.

The power supply line 170 may have contact with the surface of the porous metal oxide film 180 closer to the semiconductor substrate 110. This contact allows, in the case of forming the porous metal oxide film by anodizing the film to be anodized, the formation voltage to be applied to the entire surface of the film to be anodized close to the semiconductor substrate, thus making it possible to reduce the variation in formation voltage in the plane of the film to be anodized. Accordingly, it is possible to reduce variations in pore density and size in the plane of the porous metal oxide film.

The power supply line 570 may have contact with an end of the porous metal oxide film 580. This contact allows the surface area of the porous metal oxide film to be increased.

The semiconductor device 200 may further include the electrode pads 233 and 243 on the side closer to the first main surface 210A of the semiconductor substrate 210 and electrically connected to an external circuit, in which the porous metal oxide film 280 may include an oxide of the metal material included in the electrode pads 233 and 243. This allows the manufacturing process for the semiconductor device to be simplified.

The porous metal oxide film 580 may include an oxide of the metal material included in the power supply line 570. This allows the manufacturing process for the semiconductor device to be simplified by skipping the step of forming the film to be anodized.

The first metal film may further include the signal lines 232 and 242 electrically separated from the power supply line 270 and electrically connected to an external circuit. This separation allows the semiconductor substrate and the power supply line to be grounded.

The semiconductor device 900 may further include the capacitor electrode 993 on the side of the porous metal oxide film 980 opposite to the semiconductor substrate 910 and extending in a plurality of pores, in which capacitance may be formed between the power supply line 970 and the capacitor electrode 993 with the porous metal oxide film 980 as a dielectric film. The semiconductor device according to the present embodiment allows the opposed area between the power supply line corresponding to the opposed electrode of the capacitor and the capacitor electrode to be increased. Thus, the capacitance formed by the power supply line and the capacitor electrode can be increased.

The semiconductor device 900 may further include the capacitor electrode 993 on the side of the porous metal oxide film 980 opposite to the semiconductor substrate 910, and extending in a plurality of pores, the dielectric film 996 provided on the side of the first capacitor electrode 993 opposite to the semiconductor substrate 910 and extending in the plurality of pores, and the second capacitor electrode 998 opposed to the first capacitor electrode 993 with the dielectric film 996 interposed between the first capacitor electrode 993 and the second capacitor electrode 998, in which capacitance may be formed between the first capacitor electrode 993 and the second capacitor electrode 998. This allows the dielectric constant and film thickness of the dielectric film forming the capacitor to be changed. Accordingly, in the semiconductor device according to the present embodiment, the magnitude of the capacitance can be suitably adjusted while increasing the capacitance formed by the first capacitor electrode and the second capacitor electrode.

The semiconductor device A00 may further include the catalyst film A95 on the side of the porous metal oxide film A80 opposite to the semiconductor substrate A10 and adsorbing a gas, and the gas detection element A61 that detects a temperature change based on the amount of the gas adsorbed. This makes it possible to provide the semiconductor device which has a gas detection function.

The gas detection element A61 may detect the combustion heat in burning of the gas adsorbed on the catalyst film A95.

The gas detection element A61 may detect the reaction heat in adsorption of the gas on the catalyst film A95 or desorption the gas from the catalyst film A95.

According to another aspect of the present invention, a method for manufacturing the semiconductor device Z00 is provided, the method which includes: preparing the semiconductor substrate Z10 having the first main surface Z10A and the second main surface Z10B opposed to each other; providing the film Z89 to be anodized on the side of the first main surface Z10A of the semiconductor substrate Z10; and supplying power from the second main surface Z10B of the semiconductor substrate Z10 to anodize the film Z89 to be anodized and form the porous metal oxide film Z80 with the plurality of pores Z81.

According to the aspect mentioned above, in the manufacturing process for the semiconductor device, there is no need to provide any power supply pad or power supply line on the side of the first main surface of the semiconductor substrate wafer, thus making it possible to increase the number of semiconductor devices which can be manufactured per semiconductor substrate wafer. Furthermore, the semiconductor device according to the present embodiment is capable of reducing variations in formation voltage, due to differences in length between respective power supply lines that supply the formation voltage to respective films to be anodized. More specifically, it is possible to reduce variations in pore density and size between a plurality of porous metal oxide films formed on the same semiconductor substrate wafer. From the foregoing, it is possible to provide the semiconductor device which capable of improving the manufacturing efficiency. Furthermore, the method for manufacturing the semiconductor device according to the present embodiment is capable of improving the adhesion strength of the porous metal oxide film, as compared with a method in which a formed porous metal oxide film is provided by transfer for the semiconductor device. Thus, it is possible to improve the reliability of the semiconductor device.

The plurality of pores Z81 may be opened toward the side opposite to the semiconductor substrate Z10, and may extend in a direction that intersects with the first main surface Z10A of the semiconductor substrate Z10. This allows the surface area of the porous metal oxide film on the side opposite to the semiconductor substrate to be increased.

The method for manufacturing the semiconductor device Z00 may further include: providing the first insulating film Z20 between the first main surface Z10A of the semiconductor substrate Z10 and the film Z89 to be anodized; and providing the through hole CHZ1 in the first insulating film Z20, in which the supplying of power to the film Z89 to be anodized is through the through hole CHZ1.

In the method for manufacturing the semiconductor device Z00 according to the present embodiment, even if an insulating film is provided between the semiconductor substrate and the porous metal oxide film, the porous metal oxide film can be formed by power supply from the side of the second main surface of the semiconductor substrate. The insulating film may be omitted. More specifically, the porous metal oxide film may be provided on the semiconductor substrate, or on the semiconductor layer of the multilayer substrate.

The method for manufacturing the semiconductor device Z00 may further include implanting an impurity from the first main surface Z10A into the semiconductor substrate Z10 to form a high-concentration region that is higher in impurity concentration than the an area surrounding the high-concentration region. This allows the interface between the semiconductor substrate and the power supply line to be brought into ohmic contact. More specifically, in the method for manufacturing the semiconductor device according to the present embodiment, power loss at the interface between the semiconductor substrate and the power supply line can be reduced.

The method for manufacturing the semiconductor device Z00 may further include providing the power supply line Z70 that electrically connects the semiconductor substrate Z10 and the porous metal oxide film Z80. This allows the connection to be provided outside the porous metal oxide film in the case of the first main surface of the semiconductor substrate in planar view. Thus, elements, circuits, and the like can be provided between the semiconductor substrate and the porous metal oxide film.

The method of manufacturing the semiconductor device A00 may further include: providing the gas detection element A61 that detects a temperature change; and providing the catalyst film A95 that adsorbs a gas on the side of the porous metal oxide film A80 opposite to the semiconductor substrate A10. This makes it possible to provide the semiconductor device which has a gas detection function.

As described above, according to one aspect of the present invention, it is possible to a semiconductor device which is capable of improving the manufacturing efficiency.

It is to be noted that the embodiments described above are intended to facilitate understanding of the present invention, but not intended to construe the present invention in any limited way. Modifications and/or improvements can be made to the present invention without departing from the spirit of the present invention, and the present invention encompasses equivalents thereof. More specifically, the scope of the present invention also encompasses therein the respective embodiments with design changes appropriately made thereto by one skilled in the art, as long as the embodiments have the features of the present invention. For example, the respective elements included in the respective embodiments, and the layout, materials, conditions, shapes, sizes, and the like of the elements are not to be considered limited to those exemplified, but can be changed appropriately. In addition, the respective elements included in the respective embodiments can be combined as long as the combinations are technically possible, and the scope of the present invention also encompasses therein the combinations as long as the combinations have the features of the present invention.

DESCRIPTION OF REFERENCE SYMBOLS

100: Semiconductor device
110: Semiconductor substrate
110A: First main surface
110B: Second main surface
111: Connection
120: Insulating film
170: Power supply line
180: Porous metal oxide film
181: Pore

The invention claimed is:

1. A semiconductor device comprising:
a semiconductor substrate having a first main surface and a second main surface opposed to each other;
a porous metal oxide film on a side of the first main surface of the semiconductor substrate, the porous metal oxide film having a plurality of pores,
wherein the semiconductor substrate has a connection electrically connected to the porous metal oxide film on the side of the first main surface of the semiconductor substrate, and the semiconductor substrate is configured to provide a power supply path from the second main surface to the connection; and
a first insulating film between the semiconductor substrate and the porous metal oxide film, the first insulating film defining a through hole, and wherein the porous metal oxide film is electrically connected to the connection through the through hole of the first insulating film.

2. The semiconductor device according to claim 1, wherein the plurality of pores are opened toward a side of the porous metal oxide film opposite to the semiconductor substrate and extend in a direction that intersects with the first main surface of the semiconductor substrate.

3. The semiconductor device according to claim 1, wherein the semiconductor substrate has an electrical resistivity of 100 ·cm or less.

4. A semiconductor device according to claim 1, comprising:
a semiconductor substrate having a first main surface and a second main surface opposed to each other; and
a porous metal oxide film on a side of the first main surface of the semiconductor substrate, the porous metal oxide film having a plurality of pores,
wherein the semiconductor substrate has a connection electrically connected to the porous metal oxide film on the side of the first main surface of the semiconductor substrate, and the semiconductor substrate is configured to provide a power supply path from the second main surface to the connection, and
wherein the connection has a high-concentration region that is higher in impurity concentration than an area surrounding the high-concentration region.

5. A semiconductor device comprising:
a semiconductor substrate having a first main surface and a second main surface opposed to each other;
a porous metal oxide film on a side of the first main surface of the semiconductor substrate, the porous metal oxide film having a plurality of pores,
wherein the semiconductor substrate has a connection electrically connected to the porous metal oxide film on the side of the first main surface of the semiconductor substrate, and the semiconductor substrate is configured to provide a power supply path from the second main surface to the connection;
a first metal film including a power supply line that electrically connects the connection and the porous metal oxide film; and
an electrode pad on a side of the first main surface of the semiconductor substrate and electrically connected to an external circuit, and wherein the porous metal oxide film includes an oxide of a metal material included in the electrode pad.

6. The semiconductor device according to claim 5, wherein the power supply line has contact with a surface of the porous metal oxide film opposing the semiconductor substrate.

7. The semiconductor device according to claim 5, wherein the porous metal oxide film includes an oxide of a metal material included in the power supply line.

8. The semiconductor device according to claim 5, further comprising:
a first capacitor electrode on a side of the porous metal oxide film opposite to the semiconductor substrate and extending in the plurality of pores;
a dielectric film on a side of the first capacitor electrode opposite to the semiconductor substrate and extending in the plurality of pores; and
a second capacitor electrode opposed to the first capacitor electrode with the dielectric film interposed between the first capacitor electrode and the second capacitor electrode.

* * * * *